United States Patent
Lim et al.

(10) Patent No.: US 12,120,881 B2
(45) Date of Patent: Oct. 15, 2024

(54) THREE-DIMENSIONAL SEMICONDUCTOR DEVICES

(71) Applicant: Samsung Electronics Co., Ltd., Suwon-si (KR)

(72) Inventors: Bongsoon Lim, Seoul (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1046 days.

(21) Appl. No.: 16/931,500

(22) Filed: Jul. 17, 2020

(65) Prior Publication Data
US 2021/0074716 A1 Mar. 11, 2021

Related U.S. Application Data

(63) Continuation-in-part of application No. 16/835,484, filed on Mar. 31, 2020, now Pat. No. 11,367,735.

(30) Foreign Application Priority Data

Sep. 9, 2019 (KR) .................... 10-2019-0111467

(51) Int. Cl.
| | |
|---|---|
| H10B 43/40 | (2023.01) |
| G11C 7/18 | (2006.01) |
| G11C 8/14 | (2006.01) |
| H10B 41/10 | (2023.01) |
| H10B 41/27 | (2023.01) |
| H10B 41/35 | (2023.01) |
| H10B 41/46 | (2023.01) |

(Continued)

(52) U.S. Cl.
CPC ............ *H10B 43/40* (2023.02); *G11C 7/18* (2013.01); *G11C 8/14* (2013.01); *H10B 41/10* (2023.02);
(Continued)

(58) Field of Classification Search
CPC .. G11C 7/18; G11C 8/14; H10B 41/10; H10B 41/27; H10B 41/35; H10B 41/46;
(Continued)

(56) References Cited

U.S. PATENT DOCUMENTS 6,333,208 B1 12/2001 Li
8,058,137 B1 11/2011 Or-Bach et al.
(Continued)

FOREIGN PATENT DOCUMENTS

CN 1632952 A 6/2005
CN 104170091 A 11/2014
(Continued)

*Primary Examiner* — Michelle Mandala
*Assistant Examiner* — Kevin Quinto
(74) *Attorney, Agent, or Firm* — Muir Patent Law, PLLC

(57) ABSTRACT

Disclosed is a three-dimensional semiconductor device comprising channel regions that penetrate the stack structure and extend in a direction perpendicular to a top surface of the first substrate, a first interlayer dielectric layer on the stack structure, and a peripheral circuit structure on the first interlayer dielectric layer. The peripheral circuit structure includes peripheral circuit elements on a first surface of a second substrate. The peripheral circuit elements are electrically connected to the channel regions and at least one of the gate electrodes. The first substrate has a first crystal plane parallel to the top surface thereof. The second substrate has a second crystal plane parallel to the first surface thereof. An arrangement direction of atoms of the first crystal plane intersects an arrangement direction of atoms of the second crystal plane.

20 Claims, 20 Drawing Sheets

(51) Int. Cl.
*H10B 43/10* (2023.01)
*H10B 43/27* (2023.01)
*H10B 43/35* (2023.01)

(52) U.S. Cl.
CPC ............ *H10B 41/27* (2023.02); *H10B 41/35* (2023.02); *H10B 41/46* (2023.02); *H10B 43/10* (2023.02); *H10B 43/27* (2023.02); *H10B 43/35* (2023.02)

(58) Field of Classification Search
CPC ........ H10B 41/50; H10B 43/10; H10B 43/27; H10B 43/35; H10B 43/40; H10B 43/50
See application file for complete search history.

(56) References Cited

U.S. PATENT DOCUMENTS

| | | | |
|---|---|---|---|
| 9,484,354 B2 | 11/2016 | Lee et al. | |
| 9,558,945 B2 | 1/2017 | Fukuzumi et al. | |
| 9,773,806 B1 | 9/2017 | Lee et al. | |
| 10,211,043 B2 | 2/2019 | Noguchi et al. | |
| 10,665,580 B1* | 5/2020 | Hosoda | H10B 41/41 |
| 10,763,222 B2 | 9/2020 | Jeong et al. | |
| 2002/0063292 A1* | 5/2002 | Armstrong | H01L 27/092 |
| | | | 257/E29.051 |
| 2010/0044758 A1 | 2/2010 | Cohen et al. | |
| 2014/0035041 A1 | 2/2014 | Pillarisetty et al. | |
| 2015/0162343 A1 | 6/2015 | Park et al. | |
| 2017/0033118 A1 | 2/2017 | Fujii et al. | |
| 2017/0133400 A1 | 5/2017 | Yoo et al. | |
| 2017/0213833 A1 | 7/2017 | Godo et al. | |
| 2017/0263640 A1 | 9/2017 | Takashima et al. | |
| 2019/0081069 A1 | 3/2019 | Lu et al. | |
| 2019/0237475 A1 | 8/2019 | Jung et al. | |

FOREIGN PATENT DOCUMENTS

| | | |
|---|---|---|
| CN | 106803508 A | 6/2017 |
| JP | 2017163108 A | 9/2017 |
| WO | 2016053623 A2 | 4/2016 |

* cited by examiner

THREE-DIMENSIONAL SEMICONDUCTOR DEVICES

CROSS-REFERENCE TO RELATED APPLICATION

This U.S. nonprovisional application is a continuation-in-part of U.S. Patent Application Ser. No. 16/835,484 filed Mar. 31, 2020, in the U.S. Patent and Trademark Office, which claims priority under 35 U.S.C. § 119 to Korean Patent Application No. 10-2019-0111467, filed on Sep. 9, 2019, in the Korean Intellectual Property Office, the entire disclosures of both of which are hereby incorporated by reference.

BACKGROUND

The present inventive concepts relate to three-dimensional semiconductor devices, and more particularly, to highly-integrated three-dimensional semiconductor devices.

Semiconductor devices have been highly integrated to meet high performance and low manufacturing cost which are required by customers. Because integration of the semiconductor devices is an important factor in determining product price, high integration is increasingly requested. Integration of typical two-dimensional or planar semiconductor devices is primarily determined by the area occupied by a unit memory cell, such that it is greatly influenced by the level of technology for forming fine patterns. However, the cost of processing equipment needed to increase pattern fineness may set a practical limitation on increasing the integration of the two-dimensional or planar semiconductor devices. Therefore, there have been proposed three-dimensional semiconductor devices having three-dimensionally arranged memory cells.

SUMMARY

Some example embodiments of the present inventive concepts provide a three-dimensional semiconductor device with increased structural stability.

An object of the present inventive concepts is not limited to the mentioned above, and other objects which have not been mentioned above will be clearly understood to those skilled in the art from the following description.

According to some example embodiments of the present inventive concepts, a three-dimensional semiconductor device may comprise: a stack structure that includes a plurality of gate electrodes stacked on a first substrate; a plurality of channel regions that penetrate the stack structure and extend in a direction perpendicular to a top surface of the first substrate; a first interlayer dielectric layer on the stack structure; and a peripheral circuit structure on the first interlayer dielectric layer. The peripheral circuit structure may include a plurality of peripheral circuit elements on a first surface of a second substrate. The peripheral circuit elements may be electrically connected to the plurality of channel regions and at least one of the plurality of gate electrodes. The first substrate may have a first crystal plane parallel to the top surface of the first substrate. The second substrate may have a second crystal plane parallel to the first surface of the second substrate. An arrangement direction of atoms of the first crystal plane that are exposed on the top surface of the first substrate may intersect an arrangement direction of atoms of the second crystal plane that are exposed on the first surface of the second substrate.

According to some example embodiments of the present inventive concepts, a three-dimensional semiconductor device may comprise a cell structure and a peripheral circuit structure that are stacked on one another. The cell structure may include: a plurality of gate electrodes that are stacked on a top surface of a first substrate; a channel region that vertically penetrates the plurality of gate electrodes; and a bit line on the plurality of gate electrodes and connected to the channel region. The peripheral circuit structure may include: at least one transistor on a top surface of a second substrate; and a connection layer on the at least one transistor. The bit line may extend in a first direction. A <100> crystal direction of the first substrate may intersect a <100> crystal direction of the second substrate.

According to some example embodiments of the present inventive concepts, a three-dimensional semiconductor device may comprise: a stack structure that includes a plurality of gate electrodes stacked on a first substrate; a plurality of channel regions that penetrate the stack structure and extend in a direction perpendicular to a top surface of the first substrate; a first interlayer dielectric layer on the stack structure; a first connection layer that penetrates the first interlayer dielectric layer to come into electrical connection with the plurality of channel regions and with at least one of the plurality of gate electrodes; and a peripheral circuit structure on the first interlayer dielectric layer. The peripheral circuit structure may include: at least one transistor on a top surface of a second substrate; a second connection layer on the at least one transistor; and a second interlayer dielectric layer on the top surface of the second substrate. The second interlayer dielectric layer may cover the at least one transistor. The first substrate may have a first crystal plane parallel to the top surface of the first substrate. The second substrate may have a second crystal plane parallel to the top surface of the second substrate. A <100> crystal direction of the first crystal plane may intersect a <100> crystal direction of the second crystal plane. A source and a drain of the at least one transistor may be spaced apart from each other along a direction perpendicular to an extending direction of the first connection layer.

DETAILED DESCRIPTION OF EMBODIMENTS

Figure 1:
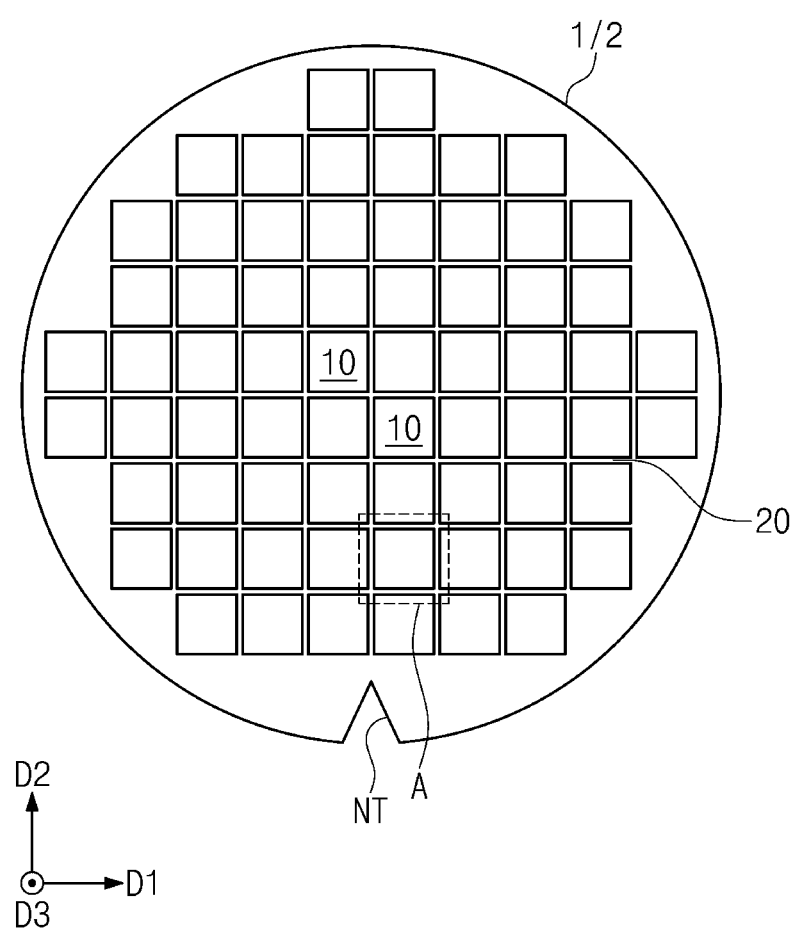
FIG. 1 illustrates a plan view showing a substrate with integrated three-dimensional semiconductor devices according to some example embodiments of the present inventive concepts.

The following will now describe a three-dimensional semiconductor device according to the present inventive concepts with reference to accompanying drawings. In the drawings, like numbers refer to like elements throughout.

Figure 2A:
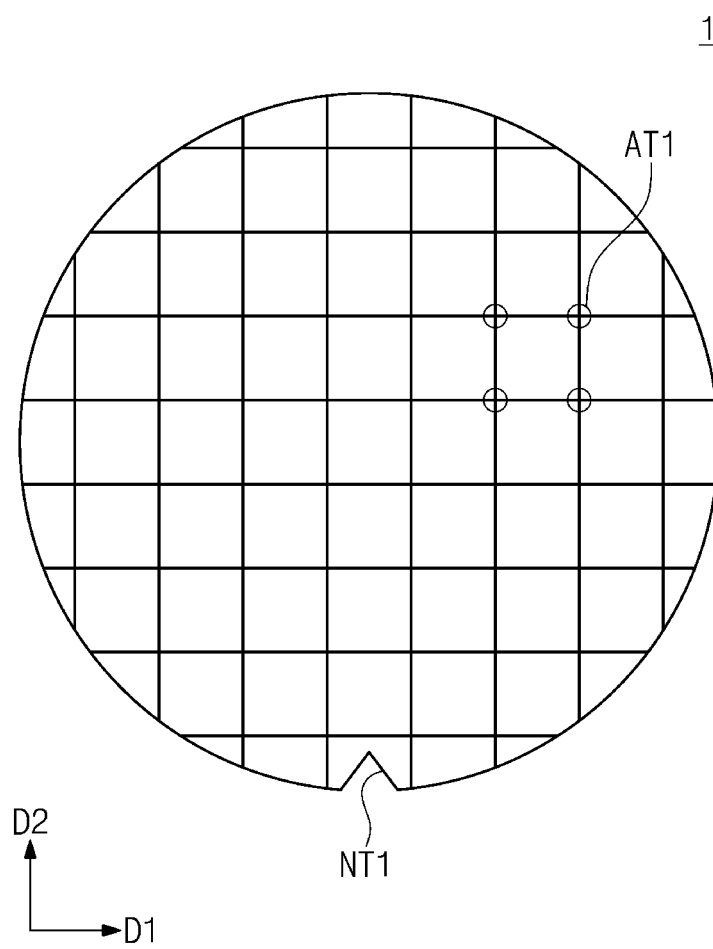
FIGS. 2A and 2B illustrate plan views respectively showing a first substrate and a second substrate.
Figure 2B:
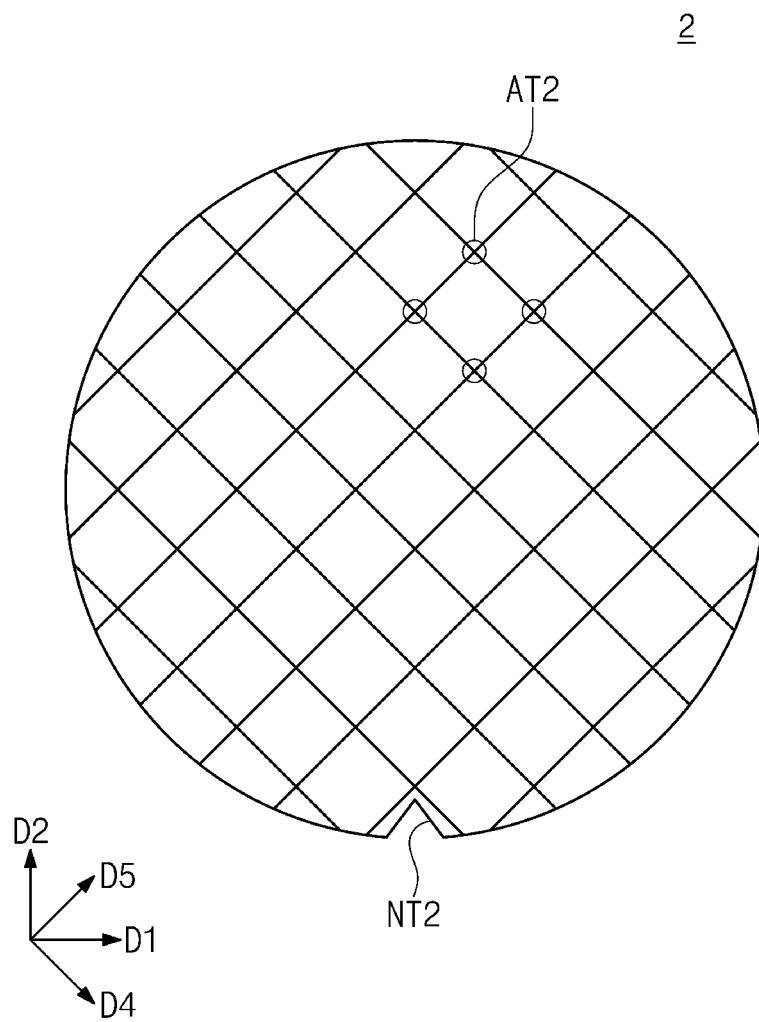

FIG. 1 illustrates a substrate on which are integrated three-dimensional semiconductor devices according to some example embodiments of the present inventive concepts. In FIG. 1, a second substrate 2 is stacked on a first substrate 1. FIGS. 2A and 2B illustrate atomic crystals respectively of the first substrate 1 and the second substrate 2. In FIGS. 2A and 2B, atomic crystals appearing on surfaces of the first and second substrates 1 and 2 are schematically illustrated, and positions of some atoms are depicted for convenience of description. FIG. 2A illustrates a top surface of the first substrate 1, and FIG. 2B illustrates a bottom surface of the second substrate 2.

Referring to FIG. 1, the first substrate 1 and the second substrate 2 may be semiconductor substrates such as, for example, semiconductor wafers. Each of the first substrate 1 and the second substrate 2 may be a bulk silicon substrate, a silicon-on-insulator (SOI) substrate, a germanium substrate, a germanium-on-insulator (GOI) substrate, a silicon-germanium substrate, or a substrate of a thin epitaxial layer obtained by performing a selective epitaxial growth (SEG). The first substrate 1 and the second substrate 2 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof. The first substrate 1 and the second substrate 2 may have a single-crystalline structure.

The first substrate 1 and the second substrate 2 may be substantially the same or similar to each other. Each of the first and second substrates 1 and 2 may include chip regions 10 on which semiconductor chips are formed and a scribe line region 20 between the chip regions 10. The chip regions 10 may be two-dimensionally arranged along first and second directions D1 and D2, which perpendicularly intersect each other. The scribe line region 20 may surround each of the chip regions 10. For example, the scribe line region 20 may be disposed between the chip regions 10 adjacent to each other in the first direction D1 and between the chip regions 10 adjacent to each other in the second direction D2. The first and second substrates 1 and 2 may have their respective notches NT1 and NT2 at one ends thereof (collectively, notch NT). The first and second substrates 1 and 2 may be stacked in a third direction D3 perpendicular to the first and second directions D1 and D2, and their notches NT1 and NT2 may be used to align the first and second substrates 1 and 2 with each other. Therefore, when viewed in plan, the chip regions 10 and the scribe line region 20 of the first substrate 1 may align and overlap with the chip regions 10 and the scribe line region 20 of the second substrate 2.

The first and second substrates 1 and 2 stacked on one another may have different atomic arrangements when viewed in plan. Referring to FIGS. 2A and 2B, an arrangement direction of atoms AT1 exposed on a top surface of the first substrate 1 may be different from that of atoms AT2 exposed on a bottom surface of the second substrate 2. In this description, the phrase "an arrangement direction of atoms" indicates a direction along which atoms most adjacent to each other are arranged on one crystal plane. Each of the top and bottom surfaces respectively of the first and second substrates 1 and 2 may be a face where chips are formed on the chip regions 10. For example, the top and bottom surfaces respectively of the first and second substrates 1 and 2 may be a {100} crystal plane of a silicon crystal structure. Therefore, silicon atoms may be arranged in a matrix shape on the top surface of the first substrate 1 and on the bottom surface of the second substrate 2. As shown in FIG. 2A, on the top surface of the first substrate 1, the atoms AT1 of silicon may be arranged along the first and second directions D1 and D2. In this description, an arrangement direction of the silicon atoms AT1 may correspond to a <110> crystal direction of a silicon crystal structure, and the notch NT1 may be oriented in a <110> crystal direction of the silicon crystal structure of the first substrate 1. As shown in FIG. 2B, on the bottom surface of the second substrate 2, the silicon atoms AT2 may be arranged along fourth and fifth directions D4 and D5, where the fourth and fifth directions D4 and D5 are perpendicular to one another. In this description, an arrangement direction of the silicon atoms AT2 may correspond to a <110> crystal direction of a silicon crystal structure, and the notch NT2 may be oriented in a <100> crystal direction of the silicon crystal structure of the second substrate 2. The fourth and fifth directions D4 and D5 may intersect the first and second directions D1 and D2, and for example, an angle of 45° may be formed between the fourth direction D4 and the first direction D1 and between the fifth direction D5 and the second direction D2. For example, in a plan view, when the notches NT1 and NT2 are used to align the first and second substrates 1 and 2 with each other, the arrangement direction of the atoms AT1 exposed on the top surface of the first substrate 1 may intersect the arrangement direction of the atoms AT2 exposed on the bottom surface of the second substrate 2.

According to some embodiments, each chip region 10 of the first and second substrates 1 and 2 may be provided thereon with a three-dimensional semiconductor device including three-dimensionally arranged memory cells.

Figure 3:
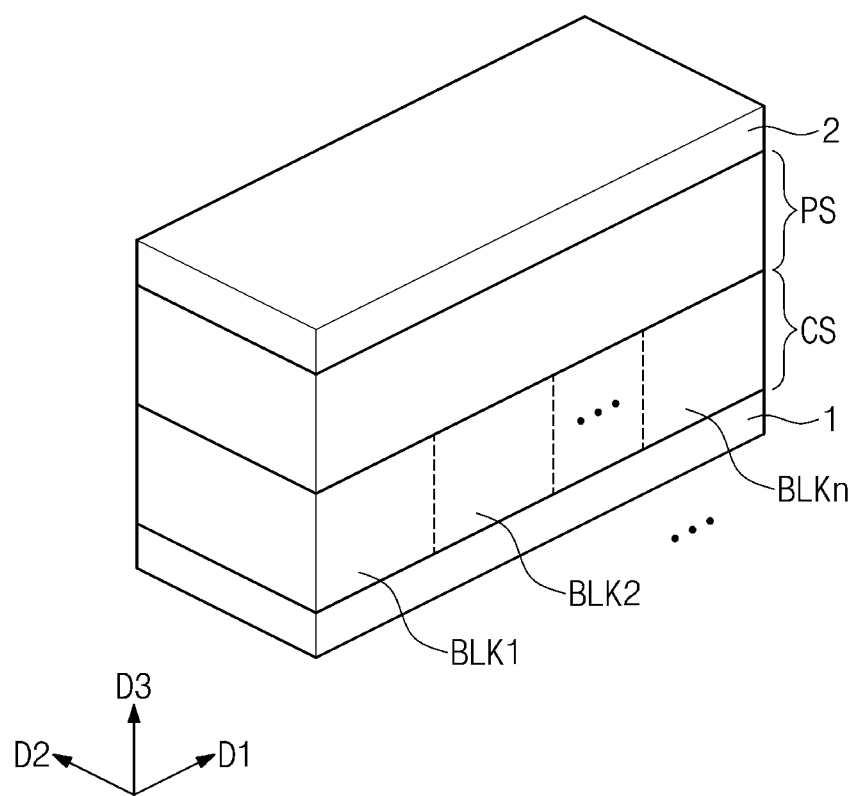
FIG. 3 illustrates a simplified perspective view showing a three-dimensional semiconductor device according to some example embodiments of the present inventive concepts.

FIG. 3 illustrates a simplified perspective view showing a three-dimensional semiconductor device according to some example embodiments of the present inventive concepts.

Referring to FIG. 3, a three-dimensional semiconductor device may include a peripheral circuit structure PS and a cell array structure CS (or referred to as a cell structure), and the peripheral circuit structure PS may be stacked on the cell array structure CS. For example, the cell array structure CS and the peripheral circuit structure PS may overlap each other when viewed in plan. The peripheral circuit structure PS integrated on the second substrate 2 may be stacked on the cell array structure CS integrated on the first substrate 1, and in this case, the cell array structure CS and the peripheral circuit structure PS may be in contact with each other.

The cell array structure CS may include a cell array having a plurality of three-dimensionally arranged memory cells. In some embodiments, the cell array may be integrated on the first substrate 1.

The cell array structure CS may include one or more mats (memory array tiles), and each of the mats may include a plurality of memory blocks BLK1 to BLKn, where each memory block is a data erase unit (e.g., the smallest unit of memory that can be erased in a single erase operation). Each of the memory blocks BLK1 to BLKn may include three-dimensionally arranged memory cells. For example, each of the memory blocks BLK1 to BLKn may include structures that are stacked along the third direction D3 on the first substrate 1.

The peripheral circuit structure PS may include a row decoder, a column decoder, a page buffer, and a control circuit that control a cell array. The second substrate 2 may be provided thereon with integrated peripheral circuits that constitute the peripheral circuit structure PS.

Figure 4:
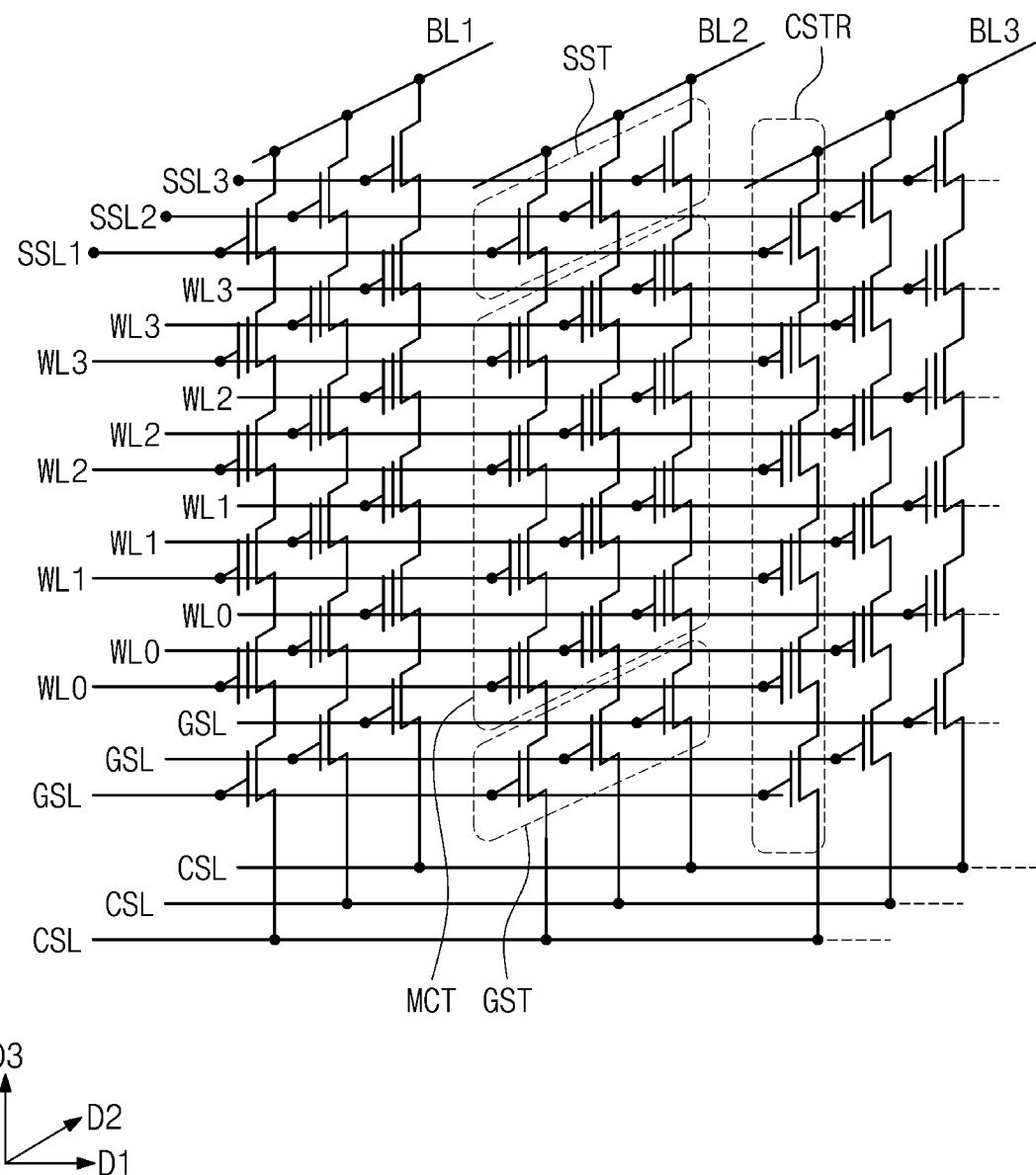
FIG. 4 illustrates a circuit diagram showing a cell array of a three-dimensional semiconductor device according to some example embodiments of the present inventive concepts.

FIG. 4 illustrates a circuit diagram showing a cell array of a three-dimensional semiconductor device according to some example embodiments of the present inventive concepts.

Referring to FIG. 4, a three-dimensional semiconductor device according to some embodiments may be a three-dimensional NAND Flash memory device. A cell array of the three-dimensional NAND Flash memory device may include a common source line CSL, a plurality of bit lines BL1 to BL3, and a plurality of cell strings CSTR between the common source line CSL and the bit lines BL1 to BL3. The cell strings CSTR may extend along a third direction D3 perpendicular to first and second directions D1 and D2.

The bit lines BL1 to BL3 may be two-dimensionally arranged, and a plurality of cell strings CSTR may be connected in parallel to each of the bit lines BL1 to BL3. The cell strings CSTR may be connected in common to the common source line CSL. For example, a plurality of cell strings CSTR may be disposed between a plurality of bit lines BL1 to BL3 and one common source line CSL. The common source line CSL may be provided in plural arranged two-dimensionally. In this configuration, the common source lines CSL may be supplied with the same voltage or may be electrically controlled independently of each other.

Each of the cell strings CSTR may include a ground select transistor GST coupled to the common source line CSL, a string select transistor SST coupled to one of the bit lines BL1 to BL3, and a plurality of memory cell transistors MCT disposed between the ground and string select transistors GST and SST. The ground select transistor GST, the string select transistor SST, and the memory cell transistors MCT may be connected in series. The common source line CSL may be connected in common to sources of the ground select transistors GST.

A ground select line GSL, a plurality of word lines WL0 to WL3, and a plurality of string select lines SSL1 to SSL3 between the common source line CSL and the bit lines BL1 to BL3 may be used as gate electrodes of the ground select transistor GST, the memory cell transistors MCT, and the string select transistor SST, respectively. Each of the memory cell transistors MCT may include a data storage element.

Figure 5A:
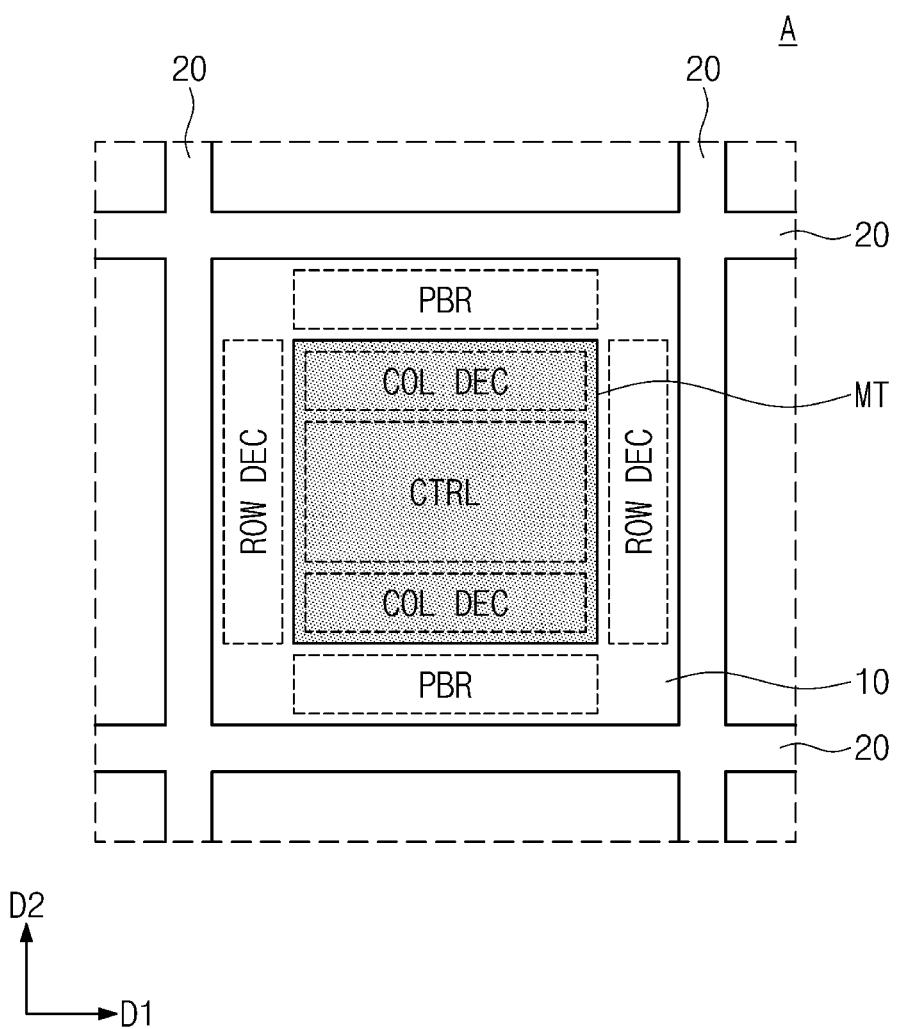
FIGS. 5A and 5B illustrate simplified enlarged plan views of section A depicted in FIG. 1, showing a three-dimensional semiconductor device according to some example embodiments of the present inventive concepts.
Figure 5B:
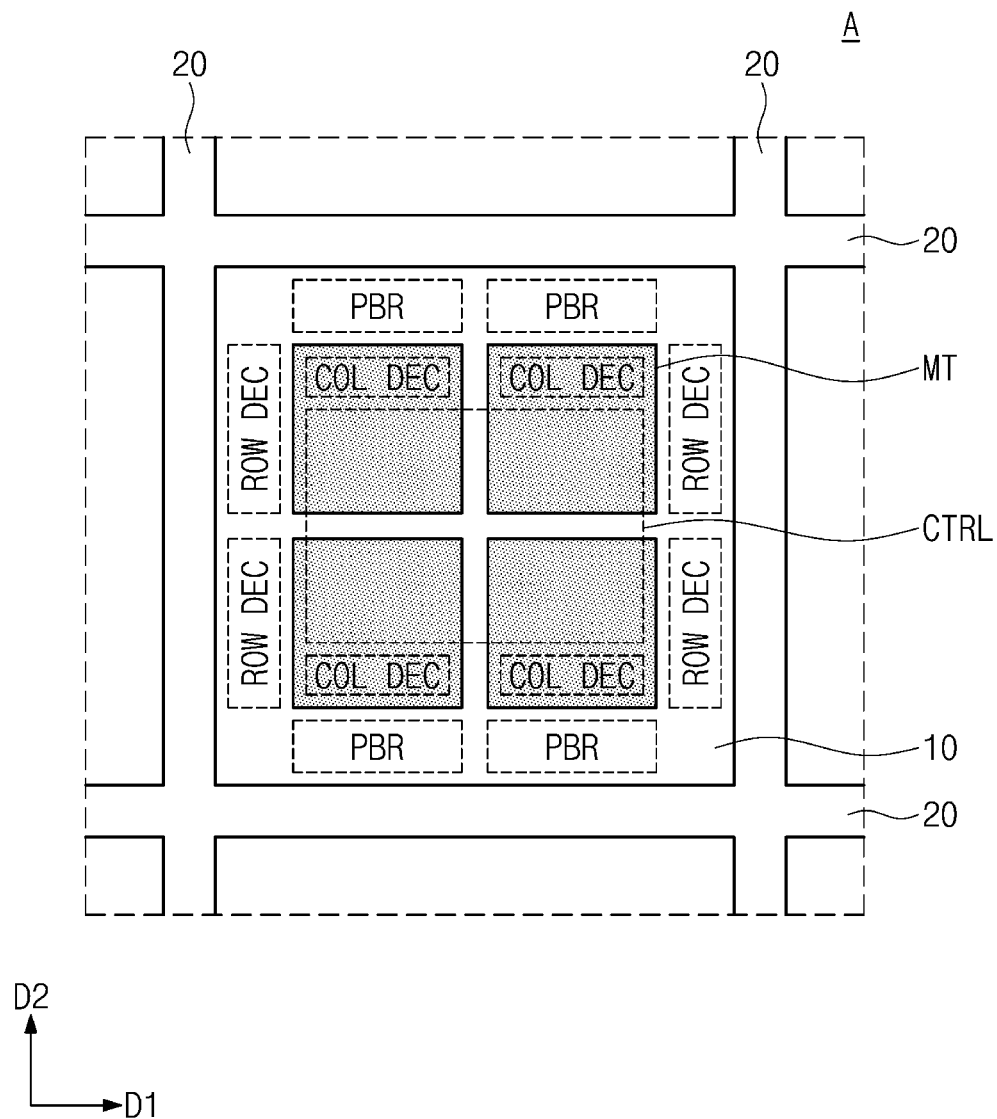

FIGS. 5A and 5B illustrate simplified enlarged plan views of section A depicted in FIG. 1, showing a three-dimensional semiconductor device according to some example embodiments of the present inventive concepts.

Referring to FIGS. 1, 5A, and 5B, the chip regions 10 of the second substrate 2 that include the peripheral circuit structure (see peripheral circuit structure PS of FIG. 3) may be correspondingly disposed on the chip regions 10 of the first substrate 1 that include the cell array structure (see cell array structure CS of FIG. 3).

Each chip region 10 of the second substrate 2 may be provided thereon with the peripheral circuit structure PS that includes row decoders ROW DEC, column decoders COL DEC, page buffers PBR, and a control circuit CTRL. The chip regions 10 may be surrounded by the scribe line region 20, and the scribe line region 20 may be used for singulation of three-dimensional semiconductor devices when a sawing process is performed in fabricating three-dimensional semiconductor devices.

Referring to FIG. 5A, on each of the chip regions 10, one mat MT or one block may be disposed to constitute the cell array structure (see cell array structure CS of FIG. 3). In some embodiments, the mat MT may be provided on the first substrate (see first substrate 1 of FIG. 3). One mat MT may be disposed to overlap a portion of the peripheral circuit structure (see peripheral circuit structure PS of FIG. 3). For example, when viewed in plan, the row decoders ROW DEC and the page buffers PBR may be disposed around the mat MT, and may not overlap the mat MT. The column decoders COL DEC and the control circuit CTRL may overlap the mat MT. For example, when viewed in plan, the column decoders COL DEC and the control circuit CTRL may be within a perimeter of the mat MT, and may be completely overlapped with the mat MT. According to some embodiments, peripheral circuits constituting the peripheral circuit structure (see peripheral circuit structure PS of FIG. 3) may be freely or arbitrarily disposed on the mat MT.

Referring to FIG. 5B, each of the chip regions 10 may be provided thereon with a plurality of mats MT or a plurality of blocks that constitute the cell array structure (see cell array structure CS of FIG. 3). The plurality of mats MT may be arranged along the first and second directions D1 and D2. In some embodiments, the plurality of mats MT may be provided on the first substrate (see first substrate 1 of FIG. 3).

Figure 6:
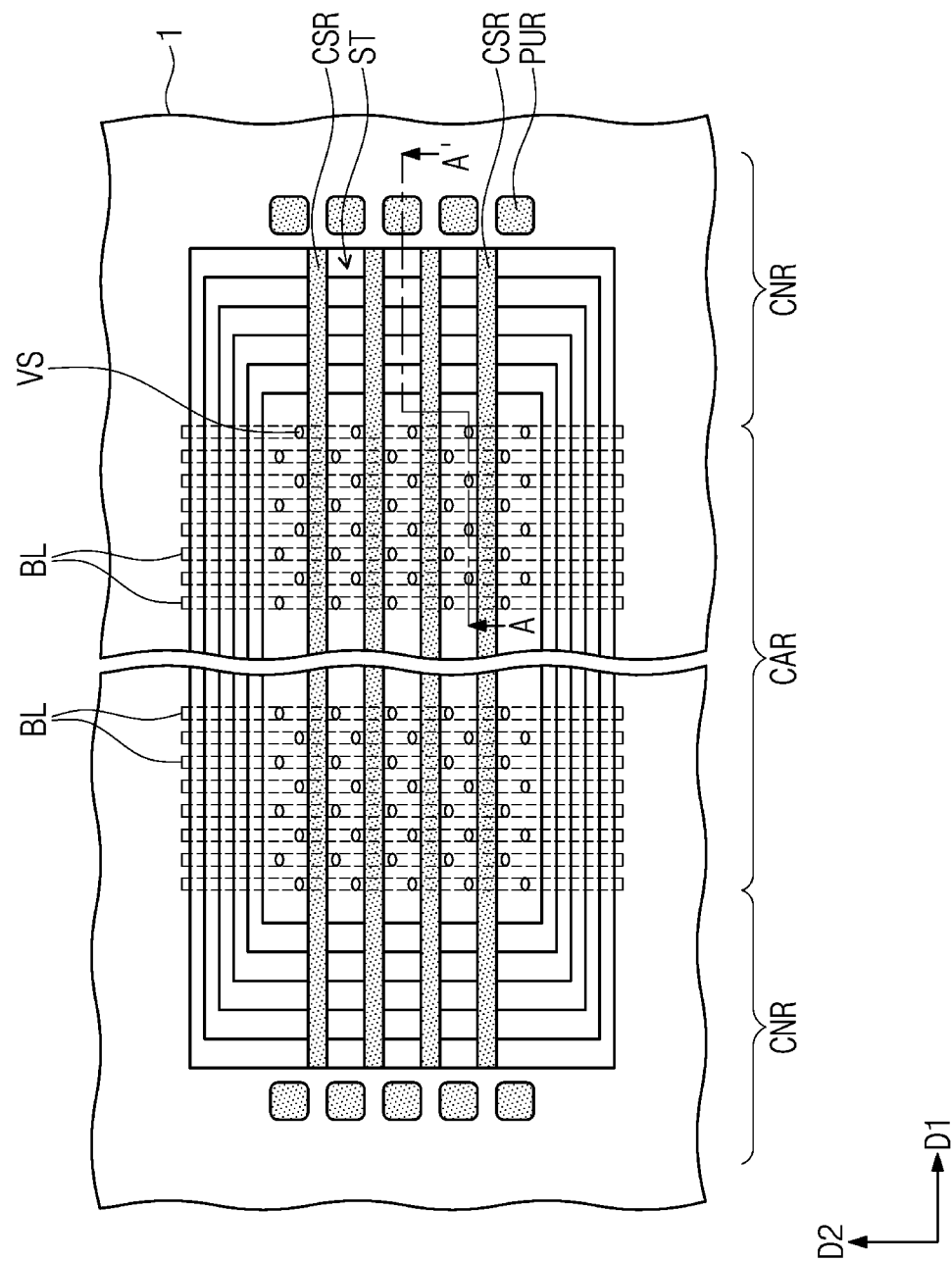
FIG. 6 illustrates a plan view showing a three-dimensional semiconductor device according to some example embodiments of the present inventive concepts.
Figure 7:
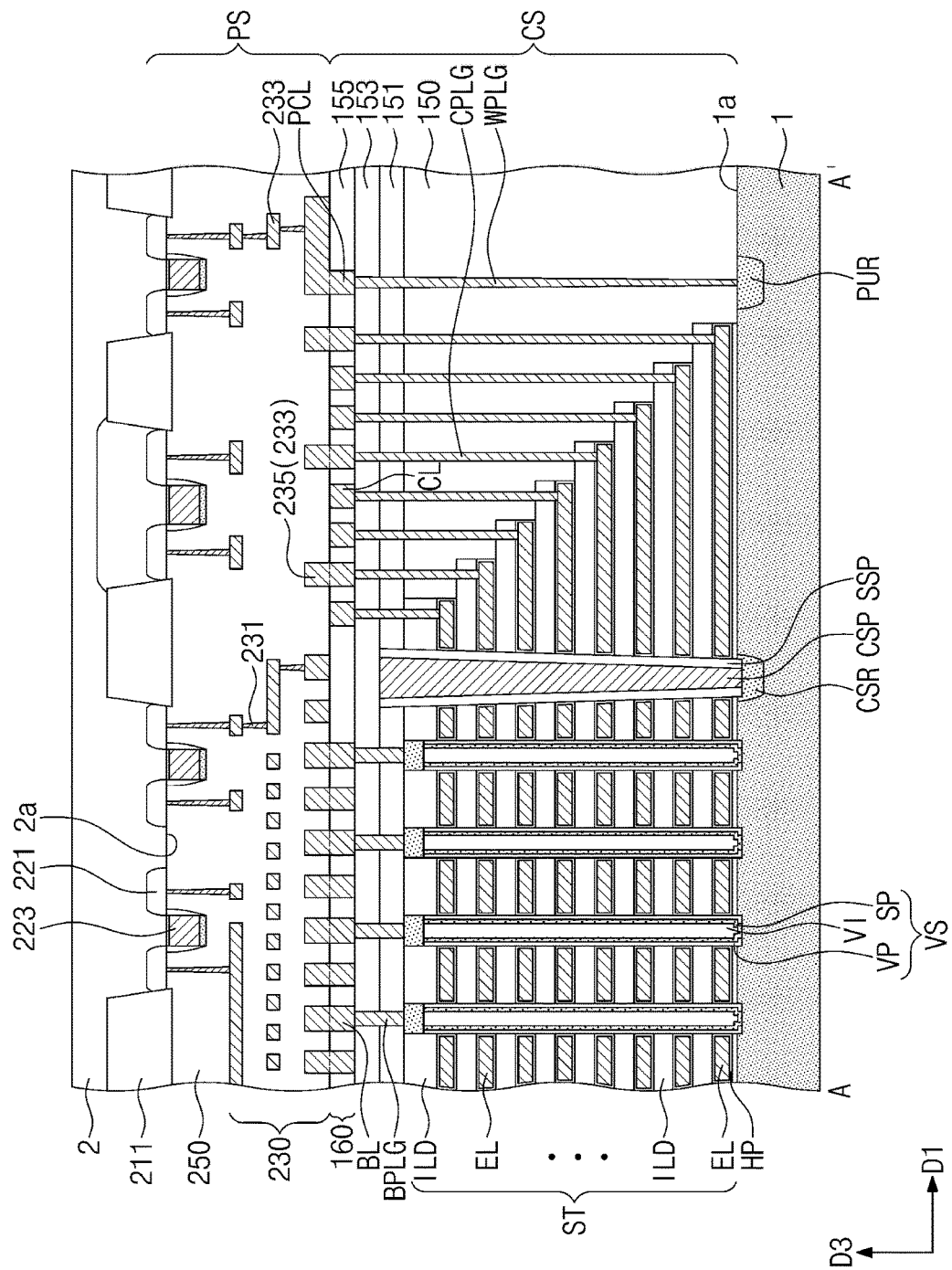
FIG. 7 illustrates a cross-sectional view taken along line A-A' of FIG. 6, showing a three-dimensional semiconductor device according to some example embodiments of the present inventive concepts.

FIG. 6 illustrates a plan view showing a three-dimensional semiconductor device according to some example embodiments of the present inventive concepts. FIG. 7 illustrates a cross-sectional view taken along line A-A' of FIG. 6, showing a three-dimensional semiconductor device according to some example embodiments of the present inventive concepts.

Referring to FIGS. 6 and 7, a first substrate 1 may be provided. The first substrate 1 may include a semiconductor material, and for example, may be a silicon (Si) substrate, a silicon-germanium (SiGe) substrate, a germanium (Ge) substrate, or a single-crystalline epitaxial layer grown on a single-crystalline silicon (Si) substrate. For example, the first substrate 1 may be a silicon substrate. The first substrate 1 may include a semiconductor doped with first conductivity type impurities or an intrinsic semiconductor with no doped impurities. The first substrate 1 may have a single-crystalline structure. A top surface 1a of the first substrate 1 may be a {100} crystal plane of a silicon crystal structure. In some embodiments, the top surface 1a of the first substrate 1 may be an active surface. In this case, as discussed with reference to FIG. 2A, a <110> crystal direction of the silicon crystal structure of the first substrate 1 may be parallel to a first direction D1 or a second direction D2. The first substrate 1 may thus have high resistance to warpage that may occur either in use or during fabrication of three-dimensional semiconductor devices. For example, silicon (Si) may have a diamond crystal structure including a face-centered-cubic (FCC) lattice, and may have high resistance to deformation in a direction normal to a {100} crystal plane. In this sense, the first substrate 1 may be highly resistant to deformation in a third direction D3 perpendicular to the first substrate 1 and sufficiently robust to resist warpage, which may result in an increase in structural stability of a three-dimensional semiconductor device.

In some embodiments, the first substrate 1 may include a cell array region CAR and a connection region CNR around the cell array region CAR.

According to some embodiments, a cell array structure CS may be provided on the first substrate 1, and may include stack structures ST, vertical structures VS, and connection line structures CPLG, CL, WPLG, and PCL.

On the first substrate 1, the stack structures ST may extend lengthwise in parallel in the first direction D1 and may be arranged spaced apart from each other in the second direction D2. Each of the stack structures ST may include electrodes EL vertically stacked on the first substrate 1 and dielectric layers ILD interposed between the electrodes EL. The dielectric layers ILD of the stack structures ST may have their thicknesses that can be changed depending on characteristics of a three-dimensional semiconductor device. For example, one or more of the dielectric layers ILD may be formed to be thicker than other ones of the dielectric layers ILD. The dielectric layers ILD may include silicon oxide (SiO). The electrodes EL may include a conductive material including, for example, a semiconductor layer, a metal silicide layer, a metal layer, a metal nitride layer, or a combination thereof.

The stack structures ST may extend lengthwise from the cell array region CAR toward the connection region CNR along the first direction D1, and may have a stepwise structure on the connection region CNR. The electrodes EL of the stack structures ST may have their lengths in the first direction D1 that decrease with increasing distance from the first substrate 1. The stack structures ST may have variously shaped stepwise structures on the connection region CNR.

In some embodiments, a three-dimensional semiconductor device may be a three-dimensional NAND Flash memory device, and cell strings (see cell strings CSTR of FIG. 4) may be integrated on the first substrate 1. In this case, the stack structures ST may be configured such that uppermost and lowermost electrodes EL may be used as gate electrodes of select transistors (see string select transistors SST and ground select transistors GST of FIG. 4). For example, the uppermost electrode EL may serve as a gate electrode of a string select transistor (see string select transistor SST of FIG. 4) that controls electrical connection between a bit line BL and the vertical structures VS, and the lowermost electrode EL may serve as a gate electrode of a ground select transistor (see ground select transistor GST of FIG. 4) that controls electrical connection between a common source line (see common source line CSL of FIG. 4) and the vertical structures VS. Other electrodes EL between the uppermost and lowermost electrodes EL may serve as control gate electrodes of memory cells and as word lines (see word lines WL0 to WL3 of FIG. 4) connecting the control gate electrodes.

On the cell array region CAR, the vertical structures VS may penetrate the stack structures ST to come into contact with the first substrate 1. The vertical structures VS may be electrically connected to the first substrate 1. When viewed in plan, the vertical structures VS may be arranged in a straight or zigzag fashion (e.g., in a linear pattern or an offset pattern). On the connection region CNR, dummy vertical structures (not shown) may be provided which have substantially the same structures as those of the vertical structures VS.

The vertical structures VS may include a semiconductor material, such as silicon (Si), germanium (Ge), or a mixture thereof. Additionally or alternatively, the vertical structures VS may include an impurity-doped semiconductor or an undoped intrinsic semiconductor. The vertical structures VS including a semiconductor material may serve as channels of the select transistors SST and GST and the memory cell transistors MCT discussed with reference to FIG. 4, and thus may be referred to as channel regions. The vertical structures VS may have their bottom surfaces between top and bottom surfaces of the first substrate 1. The vertical structures VS may each be provided on its upper end with a contact pad coupled to a bit line contact plug BPLG.

Each of the vertical structures VS may include a vertical dielectric pattern VP and a semiconductor pattern SP in contact with the first substrate 1. The semiconductor pattern SP may have a hollow pipe shape or a macaroni shape. The semiconductor pattern SP may have a closed shape at a bottom end thereof, and a buried dielectric pattern VI may fill an inside of the semiconductor pattern SP. The semiconductor pattern SP may contact the top surface 1a of the first substrate 1. The semiconductor pattern SP may be undoped or doped with impurities whose conductive type is the same as that of the first substrate 1. The semiconductor pattern SP may be polycrystalline or single crystalline.

The vertical dielectric pattern VP may be disposed between the stack structure ST and the semiconductor pattern SP. The vertical dielectric pattern VP may extend in the third direction D3 and surround a sidewall of the vertical structure VS. For example, the vertical dielectric pattern VP may have a macaroni shape or a pipe shape whose top and bottom ends are opened. The vertical dielectric pattern VP may contact the top surface 1a of the first substrate 1.

The vertical dielectric pattern VP may be formed of a single thin layer or a plurality of thin layers. In some embodiments of the present inventive concepts, the vertical dielectric pattern VP may be a portion of a data storage layer. For example, the vertical dielectric pattern VP may include a tunnel dielectric layer, a charge storage layer, and a blocking dielectric layer, which layers constitute a data storage layer of a NAND Flash memory device. For example, the charge storage layer may be a trap dielectric layer, a floating gate electrode, or a dielectric layer including conductive nano-dots. For example, the charge storage layer may include one or more of silicon nitride (SiN), silicon oxynitride (SiON), silicon-rich nitride, nano-crystalline silicon, and laminated trap layer. The tunnel dielectric layer may include one of materials whose band gap is greater than that of the charge storage layer, and the blocking dielectric layer may include a high-k dielectric material such as an aluminum oxide ($Al_2O_3$) layer and a hafnium oxide ($Hf_2O$) layer. Alternatively, the vertical dielectric pattern VP may include a thin layer either for a phase change memory device or for a variable resistance memory device.

A horizontal dielectric pattern HP may be provided between the vertical dielectric pattern VP and sidewalls of the electrodes EL. The horizontal dielectric pattern HP may extend onto top and bottom surfaces of the electrode EL from the sidewalls of the electrodes EL. The horizontal dielectric pattern HP may include a charge storage layer and a blocking dielectric layer that are portions of a data storage layer of a NAND Flash memory device. Alternatively, the horizontal dielectric pattern HP may include a blocking dielectric layer.

Common source regions CSR may be provided in the first substrate 1 between neighboring stack structures ST. The common source regions CSR may extend lengthwise in the first direction D1 parallel to the stack structures ST. The common source regions CSR may be formed by doping the first substrate 1 with impurities having a second conductivity type. The common source regions CSR may include, for example, N-type impurities (e.g., arsenic (As) or phosphorus (P)).

A common source plug CSP may be coupled to the common source region CSR. A sidewall dielectric spacer SSP may be interposed between the common source plug CSP and the stack structures ST. In a read or program mode of a three-dimensional NAND Flash memory device, a ground voltage may be applied through the common source plug CSP to the common source region CSR.

A first buried dielectric layer 150 may be disposed on the first substrate 1, covering stepwise ends of the electrodes EL. A first interlayer dielectric layer 151 may cover top surfaces of the vertical structures VS, and may be provided thereon with a second interlayer dielectric layer 153 that covers a top surface of the common source plug CSP. The first interlayer dielectric layer 151 may contact a top surface of the first buried dielectric layer 150 and the top surfaces of the vertical structures VS, and the second interlayer dielectric layer 153 may contact a top surface of the first interlayer dielectric layer 151 and the top surface of the common source plug CSP.

Bit lines BL may be provided on the second interlayer dielectric layer 153, and may extend lengthwise in the second direction D2 to thereby cross over the stack structures ST. For example, an extending direction of the bit lines BL may be parallel to a <100> crystal direction of the silicon crystal structure of the first substrate 1. Each of the bit lines BL may be electrically connected through the corresponding bit line contact plug BPLG to the vertical structure VS.

The stepwise ends of the stack structures ST may be provided thereon with a connection line structure that electrically connects the cell array structure CS to the peripheral circuit structure PS. The connection line structure may include cell contact plugs CPLG that penetrate the first and second interlayer dielectric layers 151 and 153 and the first buried dielectric layer 150 to come into connection with corresponding ends of the electrodes EL, and also include connection lines CL that are provided on the second interlayer dielectric layer 153 to come into electrical connection with corresponding cell contact plugs CPLG. Considering that the connection lines CL are connected to the electrodes EL, the connection lines CL may also be referred to as word lines. In addition, the connection line structure may include well contact plugs WPLG coupled to well pick-up regions PUR in the first substrate 1 and also include peripheral connection lines PCL connected to the well contact plugs WPLG.

The first substrate 1 may have therein the well pick-up regions PUR that are disposed adjacent to opposite ends of each of the stack structures ST. The well pick-up regions PUR may have the same conductivity type as that of the first substrate 1 and an impurity concentration greater than that of the first substrate 1. For example, the well pick-up regions PUR may include heavily doped P-type impurities (e.g., boron (B)). According to some embodiments, in an erase operation of a three-dimensional NAND Flash memory device, an erase voltage may be applied to the well pick-up regions PUR through the peripheral connection lines PCL and the well contact plugs WPLG.

The second interlayer dielectric layer 153 may be provided thereon with a third interlayer dielectric layer 155 that surrounds the bit lines BL, the connection lines CL, and the peripheral connection lines PCL. The third interlayer dielectric layer 155 may expose top surface of the bit lines BL, top surfaces of the connection lines CL, and top surfaces of the peripheral connection lines PCL. The bit lines BL, the connection lines CL, and the peripheral connection lines PCL may constitute a cell array connection layer 160.

Through the processes mentioned above, the cell array structure CS may be disposed on the first substrate 1.

According to some embodiments of the present inventive concepts, a <110> crystal direction of the silicon crystal structure of the first substrate 1 may be parallel to the first direction D1 or the second direction D2. The first substrate 1 may thus have high resistance to warpage that may occur either in use or during fabrication of three-dimensional semiconductor devices. For example, the cell array structure CS formed on the first substrate 1 may be configured such that its components (e.g., the stack structure ST or the bit line BL) may be arranged or may extend in the first and second directions D1 and D2. Accordingly, the cell array structure CS may suffer from warpage in the first direction D1 or the second direction D2. The degree of warpage when the <110> crystal direction of the silicon crystal structure of the first substrate 1 is parallel to the first direction D1 or the second direction D2 may be about 70% of the degree of warpage when the <100> crystal direction of the silicon crystal structure of the first substrate 1 is parallel to the first direction D1 or the second direction D2. In this description, the phrase "the degree of warpage" may be expressed as a difference in height between a center and an outermost edge of the first substrate 1 under the presence of warpage.

Referring back to FIGS. 6 and 7, a peripheral circuit structure PS may be disposed on the cell array structure CS.

A second substrate 2 may be provided. The second substrate 2 may be a silicon substrate, a silicon-germanium substrate, a germanium substrate, or a single-crystalline epitaxial layer grown on a single-crystalline silicon substrate. For example, the second substrate 2 may be a silicon substrate having a first conductivity type (e.g., P-type), and may include well regions. A top surface 2a of the second substrate 2 may be a {100} crystal plane of a silicon crystal structure. In some embodiments, the top surface 2a of the second substrate 2 may be an active surface. In this case, as discussed with reference to FIG. 2B, the <100> crystal direction of the silicon crystal structure of the second substrate 2 may be parallel to the first direction D1 or the second direction D2. When viewed in plan, the {100} crystal plane of the silicon crystal structure of the second substrate 2 may be oriented with respect to the {100} crystal plane of the silicon crystal structure of the first substrate 1. For example, the <100> crystal direction of silicon of the first substrate 1 and the <100> crystal direction of silicon of the second substrate 2 may intersect each other and may have an angle of 45° therebetween. Because the top surfaces 1a and 2a of the first and second substrates 1 and 2 are the same {100} crystal plane of the silicon crystal structure, a <110> crystal direction of silicon of the first substrate 1 may be parallel to a <100> crystal direction of silicon of the second substrate 2, and this configuration in one of the first and second directions D1 and D2 may be the same as that in the other of the first and second directions D1 and D2.

The peripheral circuit structure PS may include peripheral circuits that are integrated on an entire surface of the second substrate 2 and also include a second buried dielectric layer 250 that covers the peripheral circuits. The second buried dielectric layer 250 may also be referred to as an interlayer dielectric layer.

The peripheral circuits may be, as discussed above, row and column decoders, page buffers, and a control circuit, and may include a plurality of peripheral circuit elements, e.g., NMOS and PMOS transistors, low- and high-voltage transistors, and a resistor that are integrated on one surface (e.g., top surface 2a) of the second substrate 2.

For example, the second substrate 2 may be provided therein with a device isolation layer 211 that defines active regions. Peripheral gate electrodes 223 may be disposed on the active regions of the second substrate 2, and gate dielectric layers may be interposed between the peripheral gate electrodes 223 and the second substrate 2. Source/drain regions 221 may be provided in the second substrate 2 on opposite sides of each of the peripheral gate electrodes 223. The source/drain regions 221 may be spaced apart from each other in the first direction D1 or the second direction D2. In this configuration, a spacing direction between the source/drain regions 221 may be parallel to the <100> crystal direction of the silicon crystal structure of the second substrate 2. Therefore, the source/drain regions 221 and the peripheral gate electrodes 223 may constitute transistors that are highly resistant to stress that can be produced either in use or during fabrication of three-dimensional semiconductor devices. For example, silicon (Si) may have a diamond crystal structure including a face-centered-cubic (FCC) lattice, and may have high stiffness in a <110> crystal direction along which silicon atoms are densely arranged. In this configuration, transistors formed on one surface (e.g., top surface 2a) of the second substrate 2 may be highly resistant to external stress, and thus a three-dimensional semiconductor device may increase in structural stability.

Furthermore, when a spacing direction between the source/drain regions 221 is parallel to the <100> crystal direction of the silicon crystal structure of the second substrate 2, it may be possible to increase electrical characteristics of transistors formed on the second substrate 2. For example, the silicon crystal structure may have an electrical mobility that is greater in the <100> crystal direction than in the <110> crystal direction. Therefore, when an electrical flow in transistors is directed in the <100> crystal direction of the silicon crystal structure of the second substrate 2, the transistors (e.g., channels) may have an improvement in the electrical flow. In this sense, it may be possible to increase electrical characteristics of transistors where the spacing direction between the source/drain regions 221 is parallel to the <100> crystal direction of the silicon crystal structure.

A peripheral circuit connection layer 230 may be connected to the peripheral circuits on the second substrate 2. The peripheral circuit connection layer 230 may include peripheral circuit lines 233 and peripheral circuit contact plugs 231. The peripheral circuit lines 233 may be electrically connected through the peripheral circuit contact plugs 231 to the peripheral circuits. For example, the peripheral circuit contact plugs 231 and the peripheral circuit lines 233 may be coupled to the NMOS and PMOS transistors.

The second buried dielectric layer 250 may cover the peripheral gate electrodes 223, the peripheral circuit contact plugs 231, and the peripheral circuit lines 233. The second buried dielectric layer 250 may expose a portion of the peripheral circuit connection layer 230, for example, ones (referred to as exposed lines) of the peripheral circuit lines 233. The second buried dielectric layer 250 may include a plurality of stacked dielectric layers. For example, the second buried dielectric layer 250 may include one or more of silicon oxide (SiO), silicon nitride (SiN), silicon oxynitride (SiON), and low-k dielectric materials.

The cell array structure CS and the peripheral circuit structure PS may be in direct contact with each other. For example, as shown in FIG. 7, the cell array connection layer 160 of the cell array structure CS may be in contact with the peripheral circuit connection layer 230 of the peripheral circuit structure PS. For example, the third interlayer dielectric layer 155 may be in contact with the second buried dielectric layer 250, and the exposed lines 235 may be connected to the bit lines BL, the connection lines CL, and one or more of the peripheral connection lines PCL. In this case, the cell array connection layer 160 and the peripheral circuit connection layer 230 may constitute an intermetallic hybrid bonding. In this description, the term "hybrid bonding" denotes that two components of the same kind are merged at an interface therebetween. For example, the exposed lines 235 may have continuous configurations with the bit lines BL, the connection lines CL, and the peripheral connection lines PCL, and thus no boundary may be visually recognized between the exposed line 235 and each of the corresponding bit lines BL, the connection lines CL, and the peripheral connection lines PCL. For example, the exposed lines 235 may be formed of the same material as that of the bit lines BL, the connection lines CL, and the peripheral connection lines PCL, and thus no interface may be present between the exposed line 235 and each of the corresponding bit lines BL, the connection lines CL, and the peripheral connection lines PCL. Accordingly, the exposed line 235 and each of the corresponding bit lines BL, the connection lines CL, and the peripheral connection lines PCL may be formed into a single unitary body.

Figure 8:
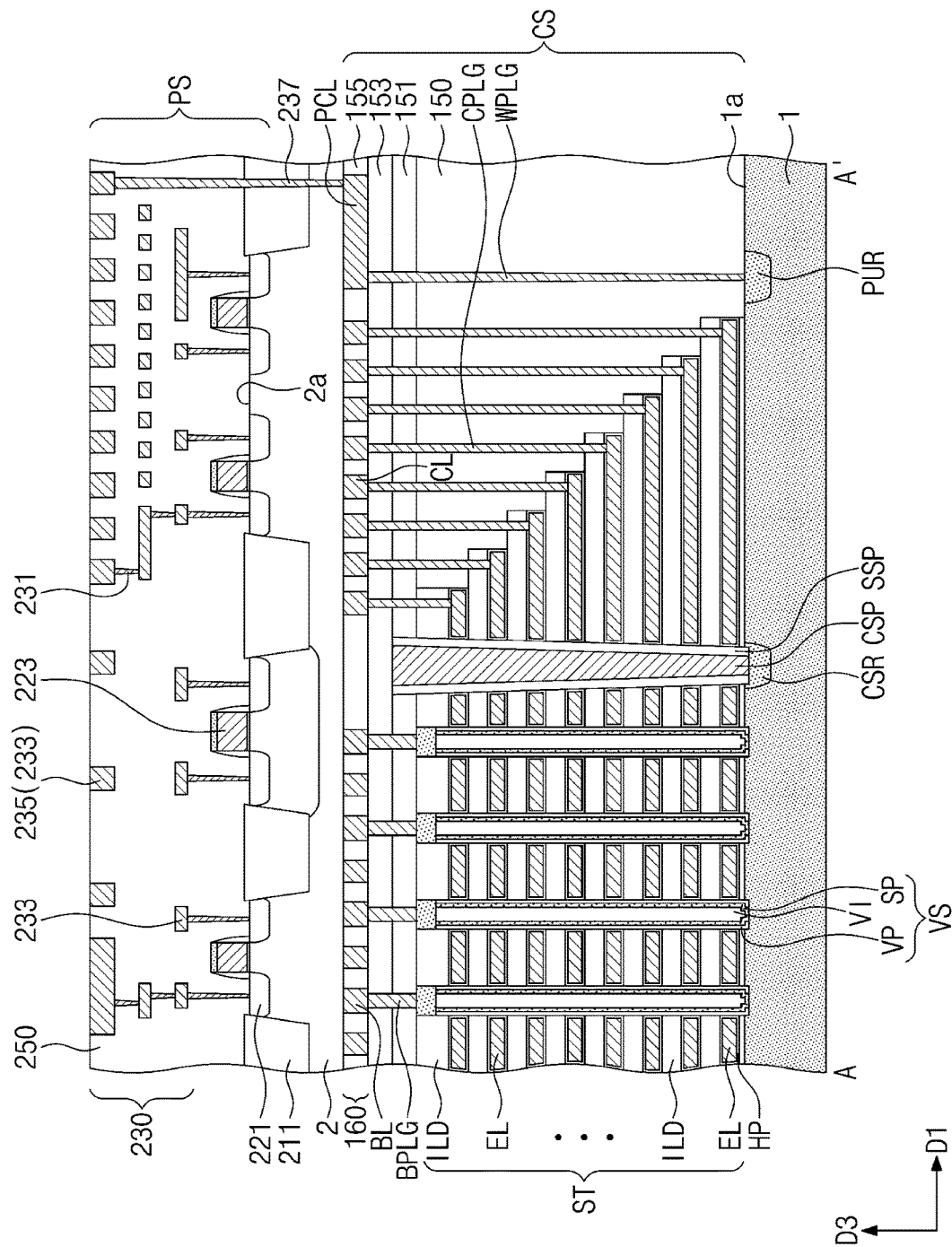
FIGS. 8 and 9 illustrate cross-sectional views showing a three-dimensional semiconductor device according to some example embodiments of the present inventive concepts.

FIG. 8 illustrates a cross-sectional view showing a three-dimensional semiconductor device according to some example embodiments of the present inventive concepts. In the embodiments that follow, components the same as those discussed with reference to FIGS. 6 and 7 are allocated the same reference numerals thereto, and a repetitive explanation thereof will be omitted or abridged for convenience of description. The following will focus on differences between the embodiments of FIGS. 6 and 7 and other embodiments described below.

Referring to FIG. 8, the peripheral circuit structure PS may be disposed on the cell array structure CS.

The cell array structure CS and the peripheral circuit structure PS may be in direct contact with each other. For example, the third interlayer dielectric layer 155 of the cell array structure CS may be in contact with the second substrate 2 of the peripheral circuit structure PS. In some embodiments, the second substrate 2 may be a polycrystalline or single-crystalline silicon layer that is deposited by deposition on the third interlayer dielectric layer 155. To electrically connect the cell array connection layer 160 to the peripheral circuit connection layer 230, the peripheral circuit connection layer 230 may further include peripheral circuit vias 237 that penetrate the second buried dielectric layer 250 and the second substrate 2. The peripheral circuit vias 237 may connect the peripheral circuit lines 233 to the peripheral connection lines PCL. Alternatively, the peripheral circuit vias 237 may connect the peripheral circuit lines 233 to the bit lines BL or the connection lines CL.

The top surface 1a of the first substrate 1 may be a {100} crystal plane of the silicon crystal structure. A <110> crystal direction of the silicon crystal structure of the first substrate 1 may be parallel to the first direction D1 or the second direction D2. The first substrate 1 may thus have high resistance to warpage capable of occurring either in use or during fabrication of three-dimensional semiconductor devices.

In addition, the top surface 2a of the second substrate 2 may be a {100} crystal plane of the silicon crystal structure.

A <100> crystal direction of the silicon crystal structure of the second substrate 2 may be parallel to the first direction D1 or the second direction D2. When viewed in plan, the <100> crystal direction of silicon of the first substrate 1 and the <100> crystal direction of silicon of the second substrate 2 may intersect each other and may have an angle of 45° therebetween. In this case, a spacing direction between the source/drain regions 221 may be parallel to the <100> crystal direction of the silicon crystal structure of the second substrate 2. Therefore, the source/drain regions 221 and the peripheral gate electrodes 223 may constitute transistors that are highly resistant to stress that may be produced either in use or during fabrication of three-dimensional semiconductor devices.

Figure 9:
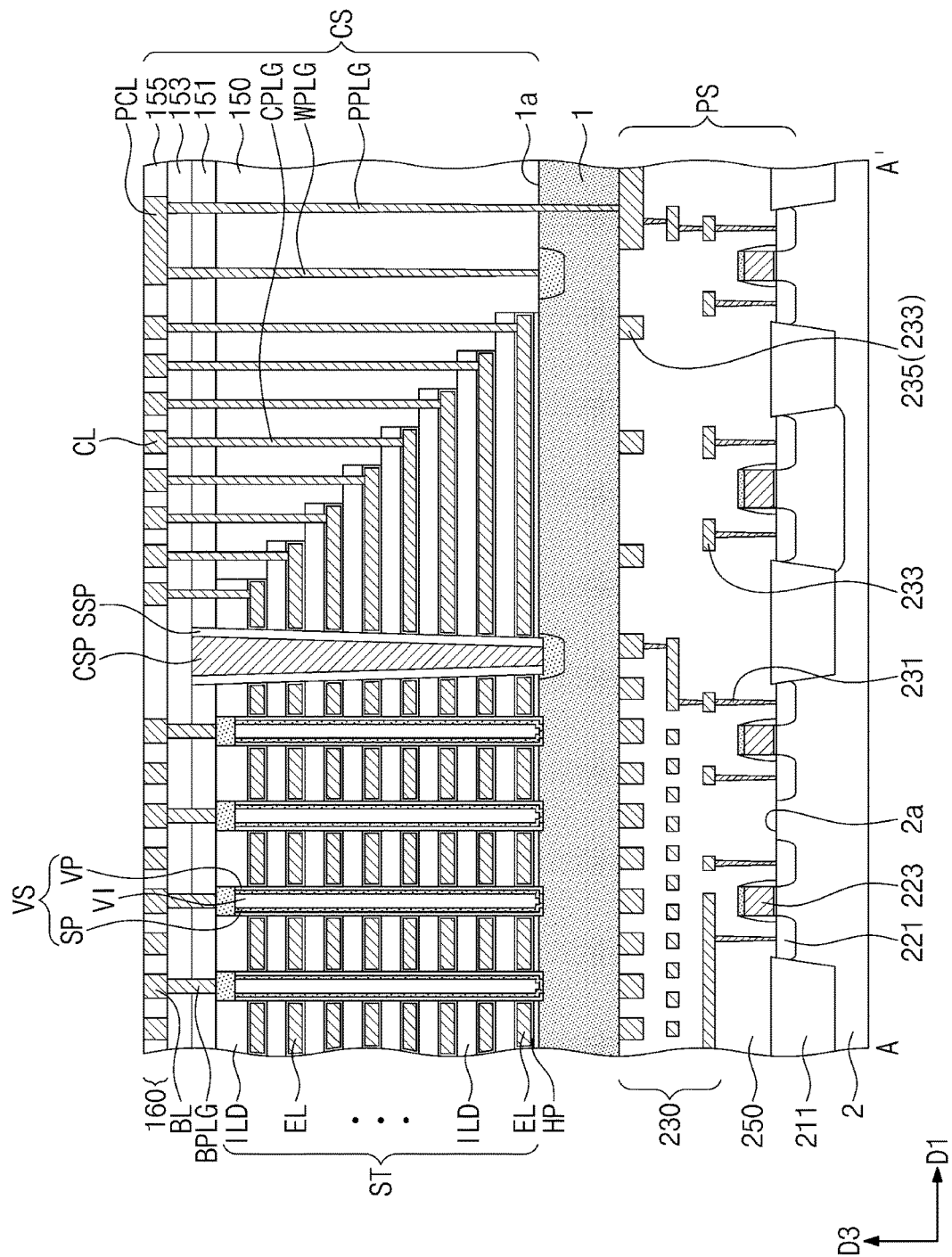

FIG. 9 illustrates a cross-sectional view showing a three-dimensional semiconductor device according to some example embodiments of the present inventive concepts.

Referring to FIG. 9, the cell array structure CS may be disposed on the peripheral circuit structure PS.

The cell array structure CS and the peripheral circuit structure PS may be in direct contact with each other. For example, the second buried dielectric layer 250 of the peripheral circuit structure PS may be in contact with the first substrate 1 of the cell array structure CS. In some embodiments, the first substrate 1 may be a polycrystalline or single-crystalline silicon layer that is deposited by deposition on the second buried dielectric layer 250. To electrically connect the cell array connection layer 160 to the peripheral circuit connection layer 230, a connection line structure of the cell array structure CS may include the connection contact plugs PPLG that penetrate the buried dielectric layer 150 and the first substrate 1 to come into connection with the peripheral circuit lines 233, and also may include the peripheral connection lines PCL that connect the well contact plugs WPLG to the connection contact plugs PPLG.

The top surfaces 1a and 2a of the first and second substrates 1 and 2 may each be a {100} crystal plane of the silicon crystal structure, a <110> crystal direction of the silicon crystal structure of the first substrate 1 may be parallel to the first direction D1 or the second direction D2, and a <100> crystal direction of the silicon crystal structure of the second substrate 2 may be parallel to the first direction D1 or the second direction D2. In this case, a spacing direction between the source/drain regions 221 may be parallel to the <100> crystal direction of the silicon crystal structure of the second substrate 2.

Figure 10:
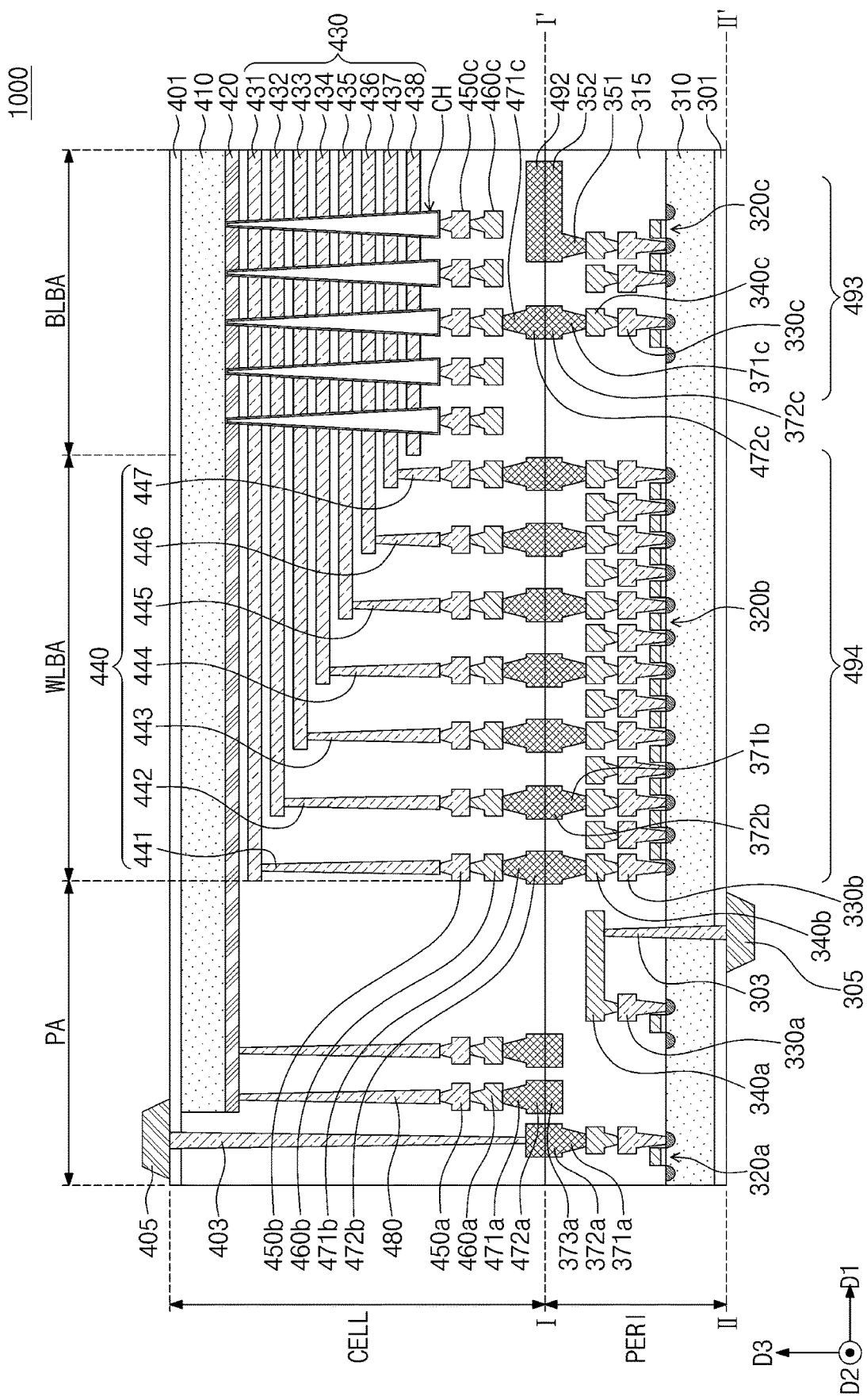
FIG. 10 illustrates cross-sectional view showing a memory device according to some example embodiments of the present inventive concepts.

FIG. 10 illustrates cross-sectional view showing a memory device according to some example embodiments of the present inventive concepts.

Referring to FIG. 10, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1000 may include an external pad bonding area PA, a word line bonding area WLBA, and a bit line bonding area BLBA.

The peripheral circuit region PERI may include a first substrate 310, an interlayer insulating layer 315, a plurality of circuit elements 320a, 320b, and 320c formed on the first substrate 310, first metal layers 330a, 330b, and 330c respectively connected to the plurality of circuit elements 320a, 320b, and 320c, and second metal layers 340a, 340b, and 340c formed on the first metal layers 330a, 330b, and 330c.

The first substrate 310 may correspond to the second substrate 2 discussed with reference to FIGS. 6 and 7. The first substrate 310 may be a silicon substrate, a silicon-germanium substrate, a germanium substrate, or a single-crystalline epitaxial layer grown on a single-crystalline silicon substrate. For example, the first substrate 310 may be a silicon substrate having a first conductivity type (e.g., P-type), and may include well regions. A front side of the first substrate 310 (corresponding to a top surface of the first substrate 310 in FIG. 10) may be a {100} crystal plane of a silicon crystal structure. In some embodiments, the top surface of the first substrate 310 may be an active surface. In this case, the <100> crystal direction of the silicon crystal structure of the first substrate 310 may be parallel to the first direction D1 or the second direction D2.

The plurality of circuit elements 320a, 320b, and 320c formed on the first substrate 310 include a precharge control circuit for controlling precharge on partial cell strings among the plurality of cell strings and controlling a plurality of data program steps on the plurality of memory cells. The plurality of circuit elements 320a, 320b, and 320c include source/drain regions. The source/drain regions may be spaced apart from each other in the first direction D1 or the second direction D2. In this configuration, a spacing direction between the source/drain regions may be parallel to the <100> crystal direction of the silicon crystal structure of the first substrate 310. Therefore, the plurality of circuit elements 320a, 320b, and 320c may be highly resistant to stress that can be produced either in use or during fabrication of memory devices. For example, silicon (Si) may have a diamond crystal structure including a face-centered-cubic (FCC) lattice, and may have high stiffness in a <110> crystal direction along which silicon atoms are densely arranged. In this configuration, transistors formed on one surface (e.g., top surface) of the first substrate 310 may be highly resistant to external stress, and thus a t memory device may increase in structural stability.

In an example embodiment, the first metal layers 330a, 330b, and 330c may be formed of tungsten having relatively high resistance, and the second metal layers 340a, 340b, and 340c may be formed of copper having relatively low resistance.

In an example embodiment illustrate in FIG. 10, although the first metal layers 330a, 330b, and 330c and the second metal layers 340a, 340b, and 340c are shown and described, they are not limited thereto, and one or more metal layers may be further formed on the second metal layers 340a, 340b, and 340c. At least a portion of the one or more metal layers formed on the second metal layers 340a, 340b, and 340c may be formed of aluminum or the like having a lower resistance than those of copper forming the second metal layers 340a, 340b, and 340c.

The interlayer insulating layer 315 may be disposed on the first substrate 310 and cover the plurality of circuit elements 320a, 320b, and 320c, the first metal layers 330a, 330b, and 330c, and the second metal layers 340a, 340b, and 340c. The interlayer insulating layer 315 may include an insulating material such as silicon oxide, silicon nitride, or the like.

Lower bonding metals 371b and 372b may be formed on the second metal layer 340b in the word line bonding area WLBA. In the word line bonding area WLBA, the lower bonding metals 371b and 372b in the peripheral circuit region PERI may be electrically connected to upper bonding metals 471b and 472b in the cell region CELL in a bonding manner, and the lower bonding metals 371b and 372b and the upper bonding metals 471b and 472b may be formed of aluminum, copper, tungsten, or the like. Further, the upper bonding metals 471b and 472b in the cell region CELL may be referred as first metal pads and the lower bonding metals 371b and 372b in the peripheral circuit region PERI may be referred as second metal pads.

The cell region CELL may include at least one memory block. The cell region CELL may include a second substrate 410 and a common source line 420.

The second substrate 410 may include a semiconductor material, and for example, may be a silicon (Si) substrate, a silicon-germanium (SiGe) substrate, a germanium (Ge) substrate, or a single-crystalline epitaxial layer grown on a single-crystalline silicon (Si) substrate. For example, the second substrate 410 may be a silicon substrate. The second substrate 410 may include a semiconductor doped with first conductivity type impurities or an intrinsic semiconductor with no doped impurities. The second substrate 410 may have a single-crystalline structure. A front side of the second substrate 410 (corresponding to a bottom surface of the second substrate 410 in FIG. 10) may be a {100} crystal plane of a silicon crystal structure. In some embodiments, the front side of the second substrate 410 may be an active surface. In this case, a <110> crystal direction of the silicon crystal structure of the second substrate 410 may be parallel to a first direction D1 or a second direction D2. The second substrate 410 may thus have high resistance to warpage that may occur either in use or during fabrication of three-dimensional semiconductor devices. For example, silicon (Si) may have a diamond crystal structure including a face-centered-cubic (FCC) lattice, and may have high resistance to deformation in a direction normal to a {100} crystal plane. In this sense, the second substrate 410 may be highly resistant to deformation in a third direction D3 perpendicular to the second substrate 410 and sufficiently robust to resist warpage, which may result in an increase in structural stability of a memory device. When viewed in plan, the {100} crystal plane of the silicon crystal structure of the second substrate 410 may be oriented with respect to the {100} crystal plane of the silicon crystal structure of the second substrate 410. For example, the <100> crystal direction of silicon of the second substrate 410 and the <100> crystal direction of silicon of the first substrate 310 may intersect each other and may have an angle of 45° therebetween. Because the front sides of the first and second substrates 310 and 410 are the same {100} crystal plane of the silicon crystal structure, a <110> crystal direction of silicon of the second substrate 410 may be parallel to a <100> crystal direction of silicon of the first substrate 310, and this configuration in one of the first and second directions D1 and D2 may be the same as that in the other of the first and second directions D1 and D2.

On the second substrate 410, a plurality of word lines 431 to 438 (i.e., 430) may be stacked in a direction (corresponding D3), perpendicular to an upper surface of the second substrate 410. At least one string select line and at least one ground select line may be arranged on and below the plurality of word lines 430, respectively, and the plurality of word lines 430 may be disposed between the at least one string select line and the at least one ground select line.

In the bit line bonding area BLBA, a channel structure CH may extend in a direction, perpendicular to the upper surface of the second substrate 410, and pass through the plurality of word lines 430, the at least one string select line, and the at least one ground select line. The channel structure CH may include a data storage layer, a channel layer, a buried insulating layer, and the like, and the channel layer may be electrically connected to a first metal layer 450c and a second metal layer 460c. For example, the first metal layer 450c may be a bit line contact, and the second metal layer 460c may be a bit line. In an example embodiment, the bit line 460c may extend in a second direction 2D, parallel to the upper surface of the second substrate 410.

In an example embodiment illustrated in FIG. 10, an area in which the channel structure CH, the bit line 460c, and the like are disposed may be defined as the bit line bonding area BLBA. In the bit line bonding area BLBA, the bit line 460c may be electrically connected to the circuit elements 320c providing a page buffer 493 in the peripheral circuit region PERI. For example, the bit line 460c may be connected to upper bonding metals 471c and 472c in the cell region CELL, and the upper bonding metals 471c and 472c may be connected to lower bonding metals 371c and 372c connected to the circuit elements 320c of the page buffer 493.

In the word line bonding area WLBA, the plurality of word lines 430 may extend in a first direction 1D, parallel to the upper surface of the second substrate 410, and may be connected to a plurality of cell contact plugs 441 to 447 (i.e., 440). The plurality of word lines 430 and the plurality of cell contact plugs 440 may be connected to each other in pads provided by at least a portion of the plurality of word lines 430 extending in different lengths in the second direction. A first metal layer 450b and a second metal layer 460b may be connected to an upper portion of the plurality of cell contact plugs 440 connected to the plurality of word lines 430, sequentially. The plurality of cell contact plugs 440 may be connected to the circuit region PERI by the upper bonding metals 471b and 472b of the cell region CELL and the lower bonding metals 371b and 372b of the peripheral circuit region PERI in the word line bonding area WLBA.

The plurality of cell contact plugs 440 may be electrically connected to the circuit elements 320b providing a row decoder 494 in the peripheral circuit region PERI. In an example embodiment, operating voltages of the circuit elements 320b providing the row decoder 494 may be different than operating voltages of the circuit elements 320c providing the page buffer 493. For example, operating voltages of the circuit elements 320c providing the page buffer 493 may be greater than operating voltages of the circuit elements 320b providing the row decoder 494. The row decoder 494 may activate at least some of the plurality of word lines 430 in response to a control of the plurality of circuit elements 320a, 320b, and 320c of the first substrate 310.

A common source line contact plug 480 may be disposed in the external pad bonding area PA. The common source line contact plug 480 may be formed of a conductive material such as a metal, a metal compound, polysilicon, or the like, and may be electrically connected to the common source line 420. A first metal layer 450a and a second metal layer 460a may be stacked on an upper portion of the common source line contact plug 480, sequentially. For example, an area in which the common source line contact plug 480, the first metal layer 450a, and the second metal layer 460a are disposed may be defined as the external pad bonding area PA.

Input-output pads 305 and 405 may be disposed in the external pad bonding area PA. Referring to FIG. 10, a lower insulating film 301 covering a lower surface of the first substrate 310 may be formed below the first substrate 310, and a first input-output pad 305 may be formed on the lower insulating film 301. The first input-output pad 305 may be connected to at least one of the plurality of circuit elements 320a, 320b, and 320c disposed in the peripheral circuit region PERI through a first input-output contact plug 303, and may be separated from the first substrate 310 by the lower insulating film 301. In addition, a side insulating film may be disposed between the first input-output contact plug 303 and the first substrate 310 to electrically separate the first input-output contact plug 303 and the first substrate 310.

Referring to FIG. 10, an upper insulating layer 401 covering the upper surface of the second substrate 410 may be formed on the second substrate 410, and a second input-output pad 405 may be disposed on the upper insulating layer 401. The second input-output pad 405 may be connected to at least one of the plurality of circuit elements 320a, 320b, and 320c disposed in the peripheral circuit region PERI through a second input-output contact plug 403.

According to embodiments, the second substrate 410 and the common source line 420 may not be disposed in an area in which the second input-output contact plug 403 is disposed. Also, the second input-output pad 405 may not overlap the word lines 430 in the third direction D3. Referring to FIG. 10, the second input-output contact plug 403 may be separated from the second substrate 410 in a direction, parallel to the upper surface of the second substrate 410, and may pass through the interlayer insulating layer 415 of the cell region CELL to be connected to the second input-output pad 405.

According to embodiments, the first input-output pad 305 and the second input-output pad 405 may be selectively formed. For example, the memory device 1000 may include only the first input-output pad 305 disposed on the first substrate 310 or the second input-output pad 405 disposed on the second substrate 410. Alternatively, the memory device 1000 may include both the first input-output pad 305 and the second input-output pad 405.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include a lower metal pattern 373a, corresponding to an upper metal pattern 472a formed in an uppermost metal layer of the cell region CELL, and having the same shape as the upper metal pattern 472a of the cell region CELL, in an uppermost metal layer of the peripheral circuit region PERI. In the peripheral circuit region PERI, the lower metal pattern 373a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 371b and 372b may be formed on the second metal layer 340b in the word line bonding area WLBA. In the word line bonding area WLBA, the lower bonding metals 371b and 372b of the peripheral circuit region PERI may be electrically connected to the upper bonding metals 471b and 472b of the cell region CELL by a Cu—Cu bonding.

Further, the bit line bonding area BLBA, an upper metal pattern 492, corresponding to a lower metal pattern 352 formed in the uppermost metal layer of the peripheral circuit region PERI, and having the same shape as the lower metal pattern 352 of the peripheral circuit region PERI, may be formed in an uppermost metal layer of the cell region CELL. A contact may not be formed on the upper metal pattern 492 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Figure 14:
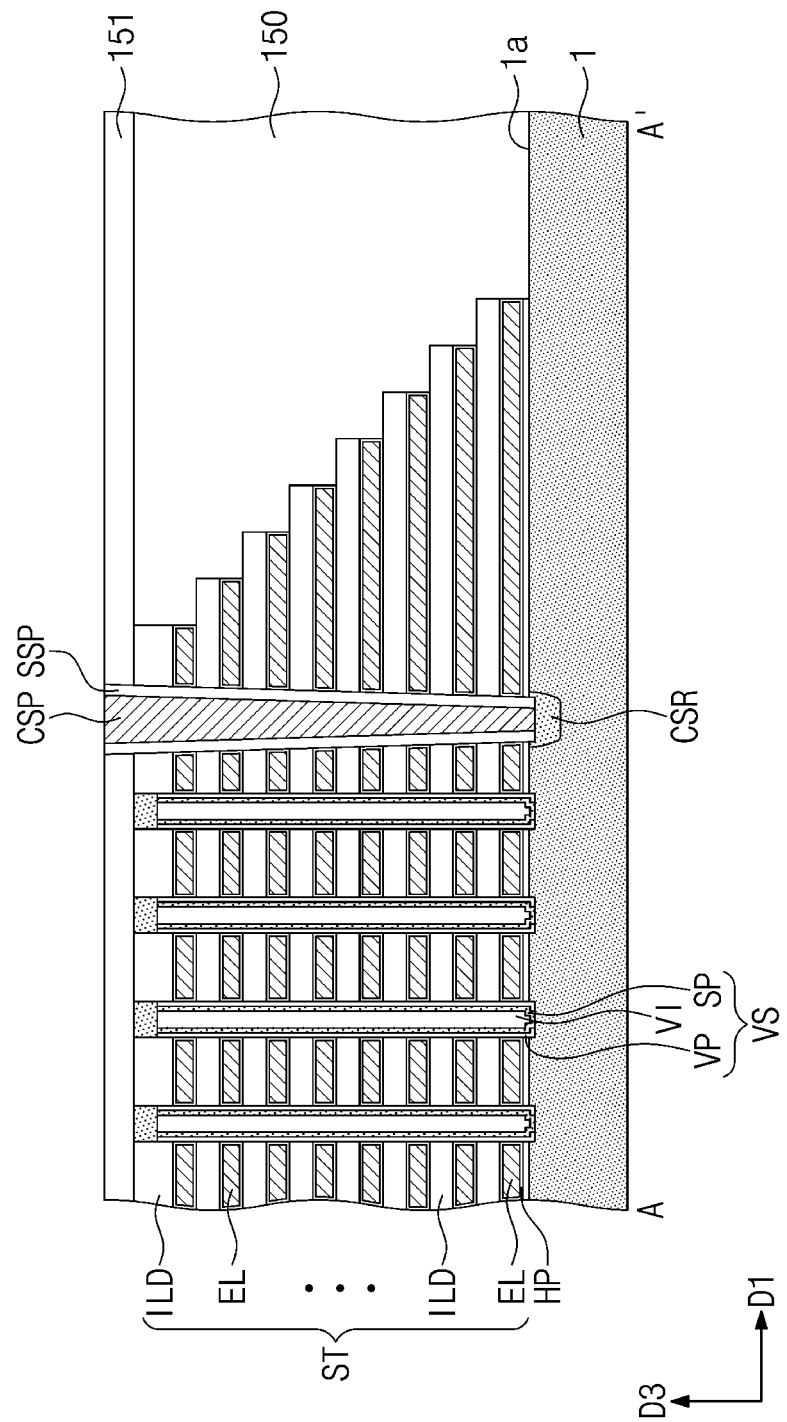
Figure 15:
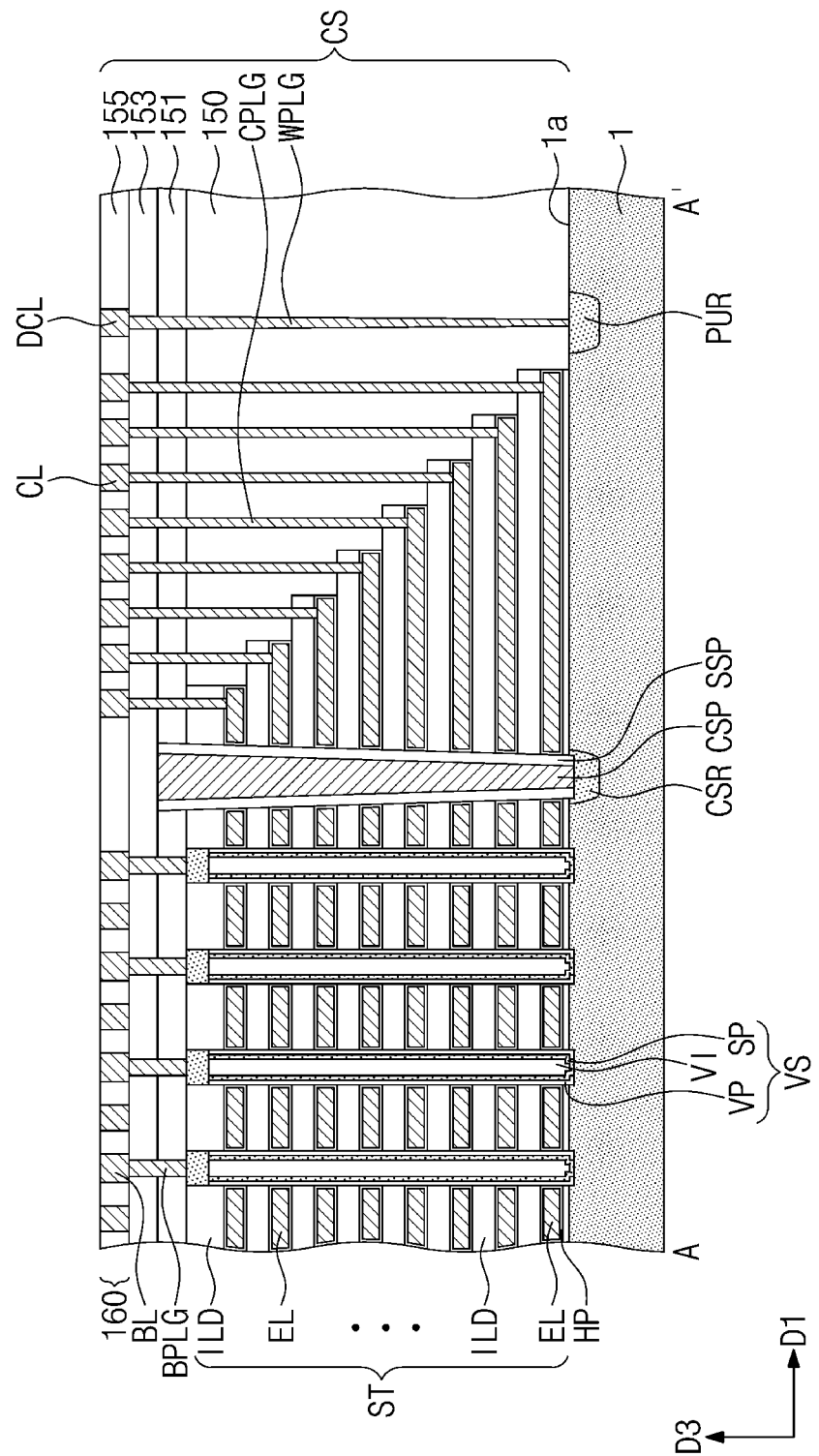
Figure 16:
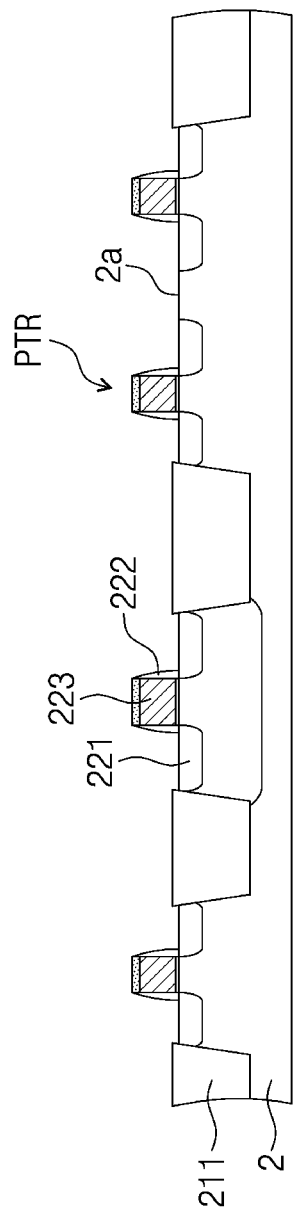
Figure 17:
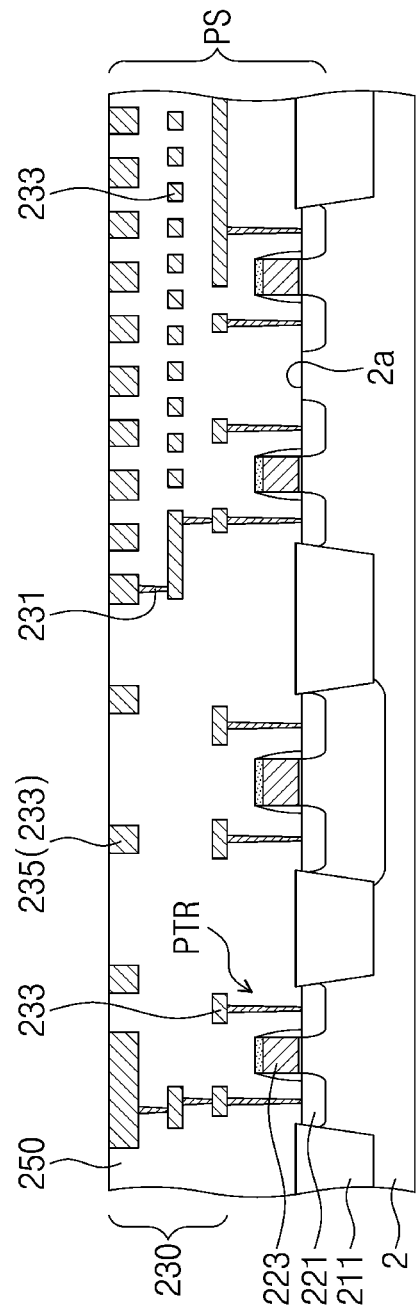

FIGS. 11 to 18 illustrate cross-sectional views showing a method of fabricating a three-dimensional semiconductor device according to some example embodiments of the present inventive concepts. FIGS. 11 to 15 show the formation of a cell array structure, and FIGS. 16 and 17 show the formation of a peripheral circuit structure.

Figure 11:
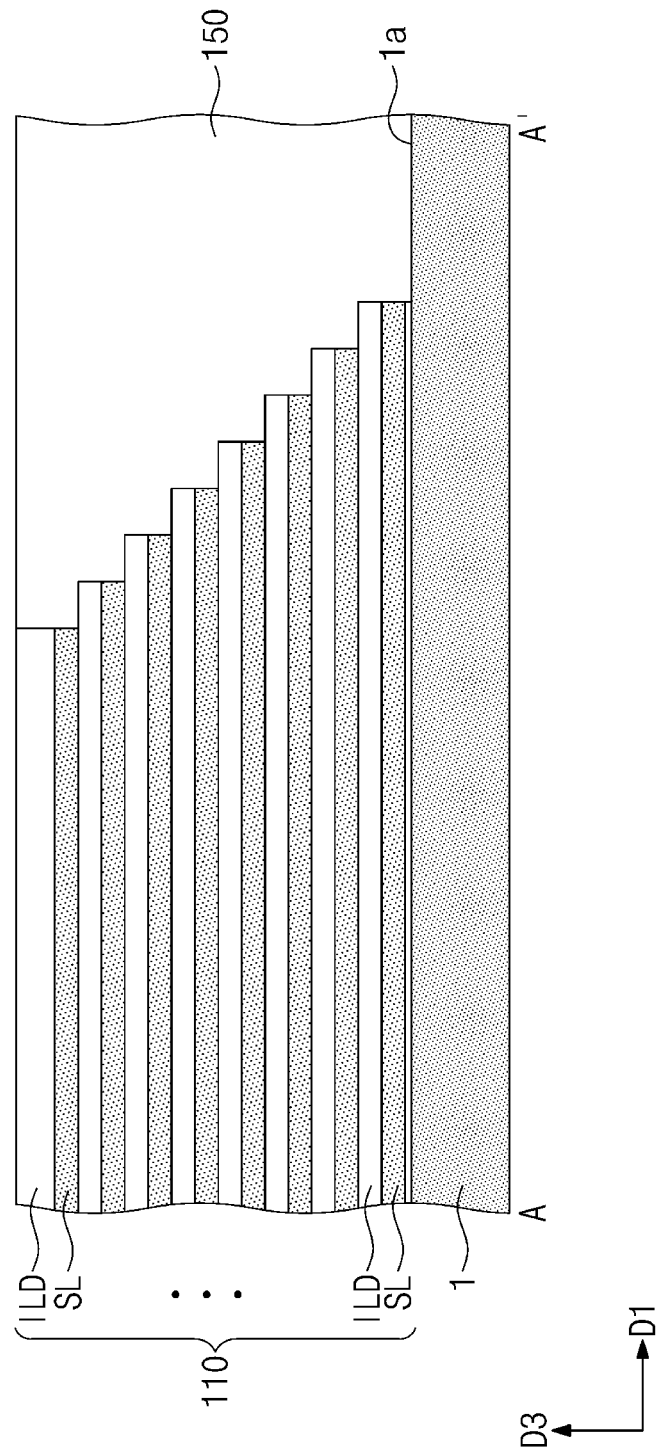
FIGS. 11 to 18 illustrate cross-sectional views showing a method of fabricating a three-dimensional semiconductor device according to some example embodiments of the present inventive concepts.

Referring to FIGS. 6 and 11, as discussed with reference to FIG. 1, a first substrate 1 may be prepared which includes chip regions and a scribe line region. For example, the first substrate 1 may be a semiconductor substrate having a first conductivity type (e.g., P-type). The first substrate 1 may be a single-crystalline silicon substrate. A top surface 1a of the first substrate 1 may be a {100} crystal plane of a silicon crystal structure. A <110> crystal direction of the silicon crystal structure of the first substrate 1 may be parallel to a first direction D1 or a second direction D2. Silicon (Si) may have a diamond crystal structure including a face-centered-cubic (FCC) lattice, and may be highly resistant to deformation in a direction normal to a crystal plane. In this sense, the first substrate 1 may be highly resistant to deformation in a third direction D3 perpendicular to the first substrate 1, and thus may be strong enough to resist warpage that may occur during fabrication of a three-dimensional semiconductor device.

A thin-layer structure may be formed on the first substrate 1. The thin-layer structure may be formed to cover an entire surface of the first substrate 1. The thin-layer structure may include sacrificial layers SL and dielectric layers ILD that are alternately and repeatedly stacked. The sacrificial layers SL of the thin-layer structure may have the same thickness. The sacrificial layers SL and the dielectric layers ILD may be formed by using thermal chemical vapor deposition (CVD), plasma-enhanced CVD, or atomic layer deposition (ALD). The sacrificial layers SL may be formed of a material that can be etched with an etch selectivity to the dielectric layers ILD. For example, the sacrificial layers SL and the dielectric layers ILD may have a high etch selectivity to a chemical solution for wet etching and a low etch selectivity to an etching gas for dry etching. For example, the sacrificial layers SL and the dielectric layers ILD may be formed of dielectric materials having different etch selectivities from each other. For example, the sacrificial layers SL may be formed of silicon nitride (SiN), and the dielectric layers ILD may be formed of silicon oxide (SiO).

Then, the thin-layer structure may undergo a patterning process to form a mold structure 110 on the first substrate 1. The mold structure 110 may be formed by performing a trimming process on the thin-layer structure. The trimming process may include forming a mask pattern (not shown) on the thin-layer structure, etching a portion of the thin-layer structure, reducing a horizontal area of the mask pattern, and alternately and repeatedly performing the etching and reducing steps. The trimming process may cause the mold structure 110 to have a stepwise structure on an edge of the first substrate 1.

A first buried dielectric layer 150 may be formed on the first substrate 1 on which the mold structure 110 is formed. The first buried dielectric layer 150 may be formed by depositing a thick dielectric layer to cover the mold structure 110 and then performing a planarization process on the dielectric layer. The first buried dielectric layer 150 may be formed of a dielectric material having an etch selectivity to the sacrificial layers SL.

Figure 12:
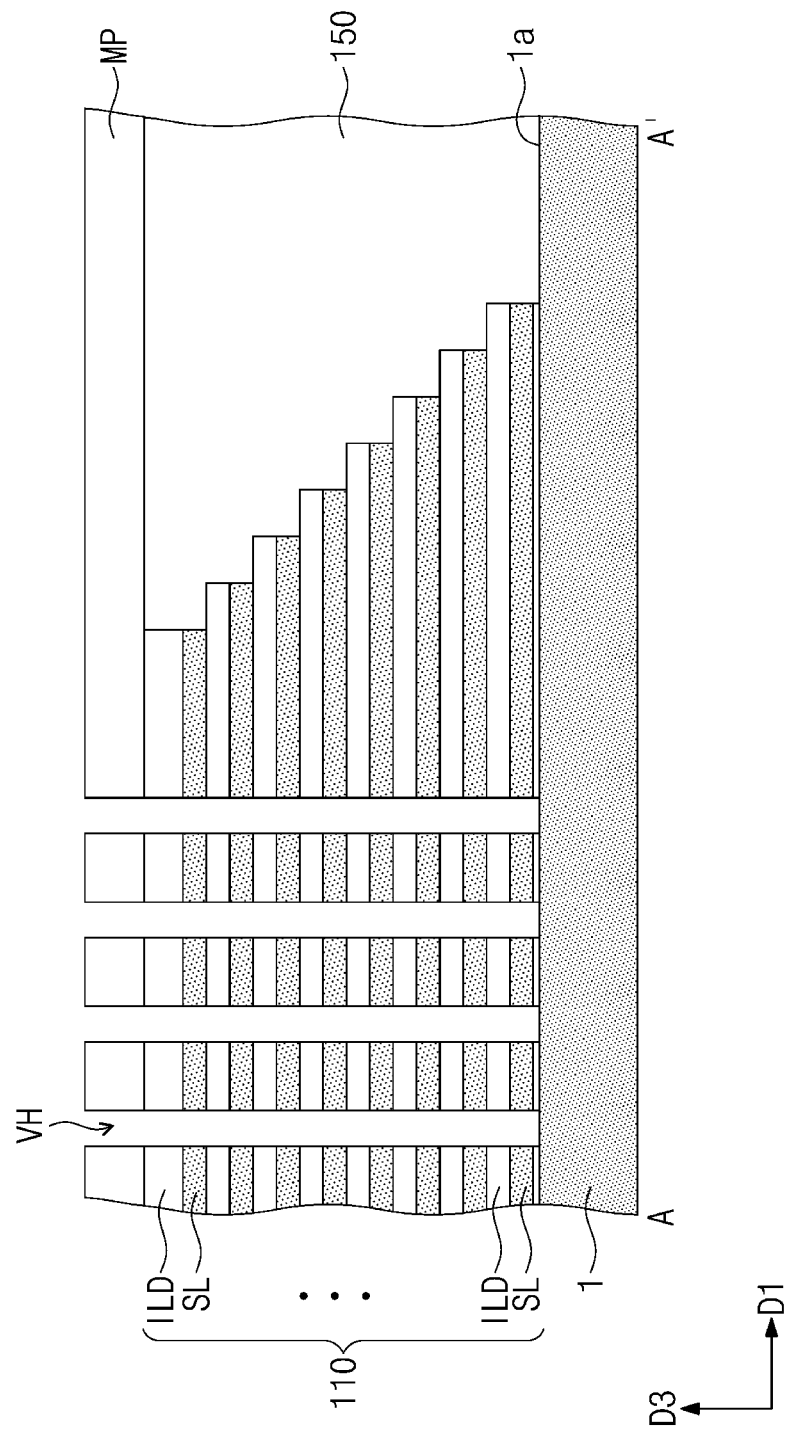

Referring to FIGS. 6 and 12, a hardmask layer MP may be formed to have openings that expose portions of the mold structure 110. The hardmask layer MP may include a silicon-containing material such as silicon oxide (SiO), silicon nitride (SiN), silicon oxynitride (SiON), or polysilicon; a carbon-containing material such as an amorphous carbon layer (ACL) or a spin-on-hardmask (SOH) layer; a metallic material such as tungsten; or an organic material. The hardmask layer MP may be formed to cover the entire surface of the first substrate 1.

An anisotropic etching process may be performed on the portions of the mold structure 110 that are exposed to the openings of the hardmask layer MP to form on the mold structure 110 a plurality of vertical holes VH that expose the first substrate 1. When viewed in plan, the vertical holes VH may be arranged along one direction or arrayed in a zigzag fashion. The anisotropic etching process on the mold structure 110 may be a plasma etching process, a reactive ion etching (RIE) process, a radio-frequency inductively coupled plasma reactive ion etching (ICP-RIE) process, or an ion beam etching (IBE) process.

Figure 13:
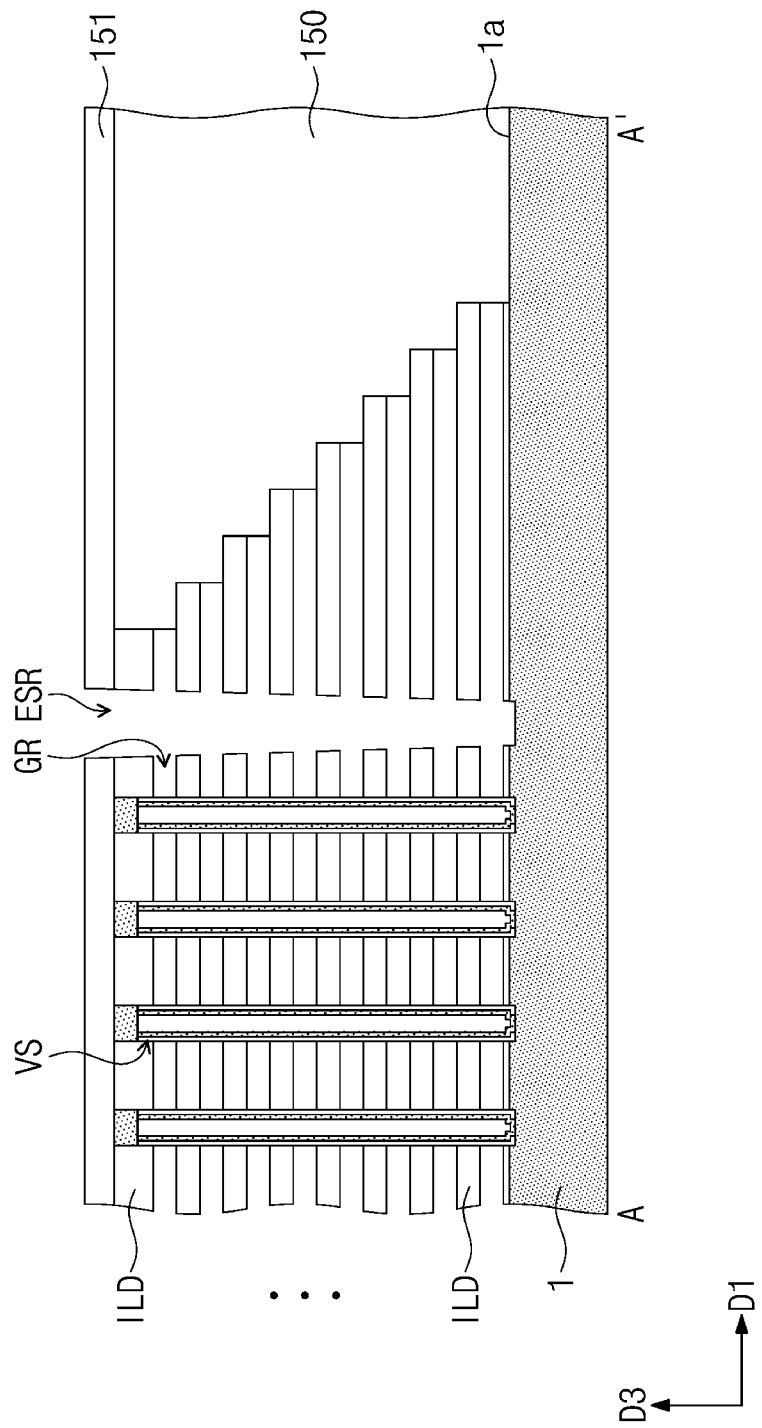

Referring to FIGS. 6 and 13, vertical structures VS may be formed in the vertical holes (see vertical holes VH of FIG. 12). As discussed above, the vertical structures VS may include a semiconductor material or a conductive material.

The formation of the vertical structures VS may include forming a semiconductor spacer to expose the first substrate 1 and to cover sidewalls of the vertical holes VH and then forming a semiconductor body connected to the first substrate 1. The vertical structures VS may include silicon (Si), germanium (Ge), or a mixture thereof, and may be an impurity-doped semiconductor or an impurity-undoped intrinsic semiconductor. The vertical structures VS may be connected to the first substrate 1. The vertical structure VS may have a conductive pad on a top end thereof. The conductive pad may be an impurity-doped region or may be formed of a conductive material.

According to some embodiment, before the vertical structures VS are formed in the vertical holes VH, as discussed with reference to FIG. 7, a vertical dielectric pattern VP may be formed in the vertical holes VH. The vertical dielectric pattern VP may be formed of a single thin layer or a plurality of thin layers. The vertical dielectric pattern VP may be a portion of a data storage layer.

After the vertical structures VS are formed, conductive layers may replace the sacrificial layers SL of the mold structure 110 such that stack structures ST may be formed to include electrodes EL that are vertically stacked on the first substrate 1. This will be described in detail with reference to FIGS. 13 and 14.

Referring again to FIGS. 6 and 13, a first interlayer dielectric layer 151 may be formed on the first buried dielectric layer 150, covering top surfaces of the vertical structures VS. After the formation of the first interlayer dielectric layer 151, electrode separation regions ESR may be formed to penetrate the mold structure (see mold structure 110 of FIG. 12) and to expose the first substrate 1. The electrode separation regions ESR may be formed by anisotropically etching the mold structure 110, and may expose sidewalls of the mold structure 110.

The electrode separation regions ESR may extend along the first direction D1 from the cell array region (see cell array region CAR of FIG. 6) toward the connection region (see connection region CNR of FIG. 6). At least one of the electrode separation regions ESR may have a length in the first direction D1 less than those of other ones of the electrode separation regions ESR. The formation of the electrode separation regions ESR may form a plurality of sub-mold structures that are spaced apart from each other in the second direction D2.

The sacrificial layers SL exposed to the electrode separation regions ESR may be removed to form gate regions GR. The gate regions GR may be formed when the sacrificial layers SL are isotropically etched using an etch recipe that has an etch selectivity to the dielectric layers ILD, the vertical structures VS, and the first substrate 1. The isotropic etching process may completely remove the sacrificial layers SL. For example, when the sacrificial layers SL include silicon nitride (SiN) and the dielectric layers ILD include silicon oxide (SiO), the isotropic etching process may be performed using an etchant that includes phosphoric acid. When the gate regions GR are formed, the vertical structures VS may prevent collapse of the dielectric layers ILD that define the gate regions GR.

The gate regions GR may be empty spaces between the dielectric layers ILD that are vertically adjacent to each other, and may partially expose the sidewalls of the vertical structures VS. The gate regions GR may also expose sidewalls of the first buried dielectric layer 150.

Referring to FIGS. 6 and 14, horizontal dielectric patterns HP and electrodes EL may be formed in the gate regions GR, such that a stack structure ST may be formed on the first substrate 1.

For example, the horizontal dielectric patterns HP and the electrodes EL may be formed by sequentially depositing a horizontal dielectric layer, a barrier metal layer (e.g., TiN, TaN, or WN), and a metal layer (e.g., W) on the mold structure 110 in which the gate regions GR are formed, and then anisotropically etching the horizontal dielectric layer and the metal layer that are deposited on inner walls of the electrode separation regions ESR. The horizontal dielectric pattern HP may include one or more of silicon oxide (SiO) and a high-k dielectric material, which serve as a portion of a data storage layer of a NAND Flash memory device.

After the formation of the electrodes EL, common source regions CSR may be formed in the first substrate 1 exposed to the electrode separation regions ESR, and the electrode separation regions ESR may be filled with a dielectric material. The common source regions CSR may include, for example, N-type impurities (e.g., arsenic (As) or phosphorus (P)). Sidewall dielectric spacers SSP may be formed on sidewalls of the electrode separation regions ESR, extending to top surfaces of the common source regions CSR. A common source plug CSP may be formed in the electrode separation regions ESR to come into contact with the common source region CSR. The common source plug CSP may be formed between the sidewall dielectric spacers SSP.

Referring to FIGS. 6 and 15, a second interlayer dielectric layer 153 may be formed on the first interlayer dielectric layer 151. Thereafter, the second interlayer dielectric layer 153, the first interlayer dielectric layer 151, and the first buried dielectric layer 150 may undergo a patterning process to form contact holes. For example, cell contact holes may be formed to expose corresponding ends of the electrodes EL on the connection region CNR. Connection contact holes may be spaced apart from the stack structure ST, while exposing the first substrate 1. Bit line contact holes may expose the vertical structures VS on the cell array region CAR.

The contact holes may be filled with a conductive material to form bit line contact plugs BPLG, cell contact plugs CPLG, and well contact plugs WPLG, as discussed with reference to FIG. 7. After that, on the second interlayer dielectric layer 153, a cell array connection layer 160 may be formed to include bit lines BL, connection lines CL, and peripheral connection lines PCL.

A third interlayer dielectric layer 155 may be formed on the second interlayer dielectric layer 153. The third interlayer dielectric layer 155 may expose top surface of the bit lines BL, top surfaces of the connection lines CL, and top surfaces of the peripheral connection lines PCL. Through the processes mentioned above, a cell array structure CS may be formed.

Referring to FIGS. 6 and 16, as discussed with reference to FIG. 1, a second substrate 2 may be prepared which includes chip regions and a scribe line region. For example, the second substrate 2 may be a semiconductor substrate having a first conductivity type (e.g., P-type). A top surface 2a of the second substrate 2 may be a {100} crystal plane of a silicon crystal structure. A <100> crystal direction of the silicon crystal structure of the second substrate 2 may be parallel to the first direction D1 or the second direction D2.

A device isolation layer 211 that defines active regions may be formed on the top surface 2a of the second substrate 2. Peripheral circuits PTR may be formed on each of the chip regions of the second substrate 2. The peripheral circuit PTR may include, for example, high-voltage and low-voltage transistors. The formation of the peripheral circuits PTR may include sequentially forming a peripheral gate dielectric layer and peripheral gate electrodes 223 on the second substrate 2, and then forming source/drain regions 221 by implanting impurities into the second substrate 2 on opposite sides of the peripheral gate electrodes 223. The source/drain regions 221 may be spaced apart from each other in the first direction D1 or the second direction D2. A spacing direction between the source/drain regions 221 may be parallel to the <100> crystal direction of silicon of the second substrate 2. Silicon (Si) may have a diamond crystal structure including a face-centered-cubic (FCC) lattice, and may have high stiffness in a <110> crystal direction along which silicon atoms are densely arranged. Therefore, the source/drain regions 221 and the peripheral gate electrodes 223 may constitute transistors that are highly resistant to stress that can be produced either in use or during fabrication of three-dimensional semiconductor devices.

Peripheral gate spacer 222 may be formed on sidewalls of the peripheral gate electrodes 223.

Referring to FIGS. 6 and 17, peripheral connection structures of the peripheral circuit connection layer 230 may be formed to have connections to the peripheral circuits PTR. For example, peripheral circuit contact plugs 231 and peripheral circuit lines 233 (including exposed lines 235) may be formed as the peripheral connection structures. To be specific, row and column decoders, page buffers, and control circuits may be formed on each of the chip regions of the second substrate 2.

After the formation of the peripheral circuits PTR and the peripheral connection structures, a second buried dielectric layer 250 may be formed to cover an entire surface of the second substrate 2. Exposed lines 235 of the peripheral circuit lines 233 may be exposed on a top surface of the second buried dielectric layer 250. The second buried dielectric layer 250 may have a planarized top surface. The second buried dielectric layer 250 may include a single dielectric layer or a plurality of stacked dielectric layers including, for example, silicon oxide (SiO), silicon nitride (SiN), silicon oxynitride (SiON), or low-k dielectric materials. Through the processes mentioned above, a peripheral circuit structure PS may be formed.

Figure 18:
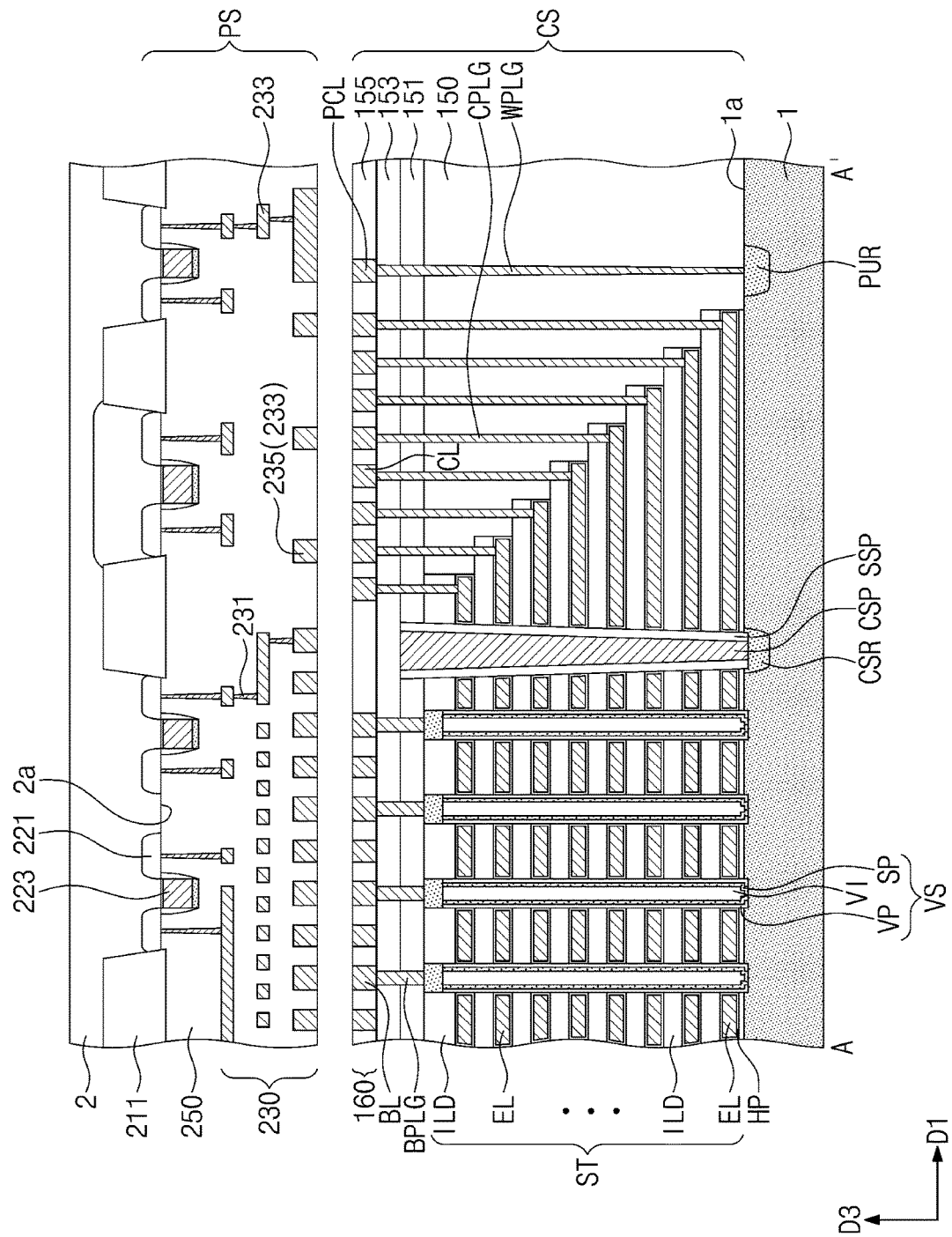

Referring to FIGS. 6 and 18, the cell array structure CS and the peripheral circuit structure PS may be bonded to each other. For example, the second substrate 2 may be positioned on the first substrate 1. The second substrate 2 may be disposed to allow the peripheral circuit structure PS to face the cell array structure CS. In this case, the peripheral circuit connection layer 230 of the peripheral circuit structure PS may be aligned with the cell array connection layer 160 of the cell array structure CS. For example, the exposed lines 235 of the peripheral circuit structure PS may be aligned with the bit lines BL, the connection lines CL, and the peripheral connection lines PCL of the cell array structure CS.

Notches NT1 and NT2, discussed in FIG. 1, may be used to align the first and second substrates 1 and 2 with each other. The first and second substrates 1 and 2 may have different crystal directions from each other. For example, the <110> crystal direction of the silicon crystal structure of the first substrate 1 may be parallel to the first direction D1 or the second direction D2, and the <100> crystal direction of the silicon crystal structure of the second substrate 2 may be parallel to the first direction D1 or the second direction D2. When viewed in plan, the {100} crystal plane of the silicon crystal structure of the second substrate 2 may be inconsistent with the {100} crystal plane of the silicon crystal structure of the first substrate 1. For example, the <100> crystal direction of silicon of the first substrate 1 and the <100> crystal direction of silicon of the second substrate 2 may intersect each other and may have an angle of 45° therebetween. Because the top surfaces of the first and second substrates 1 and 2 are the same {100} crystal plane of the silicon crystal structure, the <110> crystal direction of silicon of the first substrate 1 may be parallel to the <100> crystal direction of silicon of the second substrate 2, and this configuration in one of the first and second directions D1 and D2 may be the same as that in the other of the first and second directions D1 and D2.

Referring to FIGS. 6 and 7, the peripheral circuit structure PS may be coupled to the cell array structure CS. For example, the exposed lines 235 of the peripheral circuit structure PS may be in contact with the bit lines BL, the connection lines CL, and the peripheral connection lines PCL of the cell array structure CS. The second buried dielectric layer 250 of the peripheral circuit structure PS may be in contact with the third interlayer dielectric layer 155 of the cell array structure CS.

The peripheral circuit connection layer 230 of the peripheral circuit structure PS may be in contact with the cell array connection layer 160 of the cell array structure CS. For example, the exposed line 235 of the peripheral circuit structure PS may be combined with each of the bit line BL, the connection line CL, and the peripheral connection line PCL of the cell array structure CS, such that the exposed line 235 and its combined any one of the bit line BL, the connection line CL, and the peripheral connection line PCL may be formed into a single element. The exposed lines 235 of the peripheral circuit structure PS may be automatically combined with the bit lines BL, the connection lines CL, and the peripheral connection lines PCL of the cell array structure CS. For example, the peripheral circuit connection layer 230 and the cell array connection layer 160 may include the same material (e.g., copper), and may be bonded to each other by an intermetallic hybrid bonding process (e.g., Cu—Cu hybrid bonding) due to a surface activation at an interface between the peripheral circuit connection layer 230 and the cell array connection layer 160 that are in contact with each other.

Afterwards, a cutting or sawing machine may be utilized to cut the first and second substrates 1 and 2 along the scribe line region, and therefore three-dimensional semiconductor devices formed on the first and second substrates 1 and 2 may be divided into a plurality of semiconductor chips.

A three-dimensional semiconductor device according to some embodiments of the present inventive concepts may be configured such that a first substrate has high resistance to warpage capable of occurring either in use or during fabrication of the three-dimensional semiconductor device. The first substrate may be highly resistant to deformation in a direction normal to the first substrate and sufficiently robust to resist warpage. In addition, the three-dimensional semiconductor device may be configured such that transistors of a peripheral circuit structure are highly resistant to stress capable of being produced in use or during fabrication of the three-dimensional semiconductor device. Transistors formed on one surface of a second substrate may be strong enough to resist external stress. As a result, the three-dimensional semiconductor device may increase in structural stability.

Although the present invention has been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A memory device comprising:
a memory cell region including a first metal pad on a first substrate;
a peripheral circuit region including a second metal pad on a second substrate and vertically connected to the memory cell region by the first metal pad and the second metal pad;
a memory cell array in the memory cell region including a plurality of cell strings including a plurality of memory cells, a plurality of word lines respectively connected to the plurality of memory cells, a plurality of bit lines connected to one side of the plurality of cell strings, and a ground selection line connected to the plurality of cell strings;
a control logic in the peripheral circuit region including a precharge control circuit for controlling precharge on partial cell strings among the plurality of cell strings and controlling a plurality of data program steps on the plurality of memory cells; and
a row decoder in the peripheral circuit region for activating at least some of the plurality of word lines in response to a control of the control logic,
wherein the first substrate has a first crystal plane parallel to a first surface of the first substrate which faces the first metal pad,
wherein the second substrate has a second crystal plane parallel to a second surface of the second substrate which faces the second metal pad, and
wherein an arrangement direction of atoms of the first crystal plane that are exposed on the first surface of the first substrate intersects an arrangement direction of atoms of the second crystal plane that are exposed on the second surface of the second substrate.

2. The memory device of claim 1, wherein the first crystal plane of the first substrate and the second crystal plane of the second substrate are a {100} crystal plane of silicon.

3. The memory device of claim 2, wherein a <110> crystal direction of silicon of the first substrate is parallel to a <100> crystal direction of silicon of the second substrate.

4. The memory device of claim 2, wherein a <100> crystal direction of silicon of the first substrate has an angle of 45° with a <100> crystal direction of silicon of the second substrate.

5. The memory device of claim 1,
wherein the memory cell region further comprises a first interlayer insulating layer on the first surface of the first substrate, the first interlayer insulating layer covering the plurality of cell strings, the plurality of word lines, the plurality of bit lines, and the ground selection line,
wherein the peripheral circuit region further comprises a second interlayer insulating layer on the second surface of the second substrate, the second interlayer insulating layer covering the control logic, and
wherein the first interlayer insulating layer is in contact with the second interlayer insulating layer.

6. The memory device of claim 5, wherein the first metal pad and the second metal pad are in contact with each other at an interface between the first interlayer insulating layer and the second interlayer insulating layer.

7. The memory device of claim 6, wherein, at the interface between the first interlayer insulating layer and the second interlayer insulating layer, the first metal pad and the second metal pad constitute a single unitary body consisting of the same material.

8. The memory device of claim 1, wherein at least one of the plurality of word lines and the plurality of bit lines extend in a <110> crystal direction of silicon of the first substrate.

9. The memory device of claim 1, further comprising:
a page buffer in the peripheral circuit region for activating at least some of the plurality of bit lines in response to the control of the control logic,
wherein the precharge control circuit controls the page buffer so that a precharge voltage is applied to some bit lines, among the plurality of bit lines, during the precharge.

10. The memory device of claim 1,
wherein the control logic includes at least one transistor, and
wherein a source and a drain of the transistor are spaced apart from each other in a <100> crystal direction of silicon of the second substrate.

11. The memory device of claim 1, wherein the memory cell array comprises:

a plurality of gate electrodes stacked on the first substrate and respectively connected to the plurality of word lines; and a plurality of channel regions that extend in a direction perpendicular to the first surface of the first substrate through the plurality of gate electrodes.

12. The memory device of claim 1, wherein the first metal pad and the second metal pad are formed of copper.

13. The memory device of claim 1, wherein the first metal pad and the second metal pad are connected by bonding.

14. A memory device comprising a cell structure and a peripheral circuit structure that are stacked on one another,
wherein the cell structure includes:
a plurality of gate electrodes that are stacked on a first surface of a first substrate;
a plurality of channel regions that vertically penetrates the plurality of gate electrodes;
a first interlayer insulating layer on the first surface of the first substrate, the first interlayer insulating layer covering the plurality of gate electrodes and the plurality of channel regions;
a plurality of first metal pads exposed on the first interlayer insulating layer, the plurality of first metal pads being connected to the plurality of gate electrodes and the plurality of channel regions; and
a plurality of bit lines extending in a first direction,
wherein the peripheral circuit structure includes:
at least one transistor on a second surface of a second substrate;
a second interlayer insulating layer on the second surface of the second substrate, the second interlayer insulating layer covering the transistor; and
a plurality of second metal pads exposed on the second interlayer insulating layer, the plurality of second metal pads being connected to the transistor,
wherein the peripheral circuit structure is vertically connected to the cell structure by the plurality of first metal pads and the plurality of second metal pads,
wherein a <100> crystal direction of the first substrate intersects a <100> crystal direction of the second substrate,
wherein the <110> crystal direction of the first substrate is the same as the first direction, and
wherein the <100> crystal direction of the second s st rate is the same as the first direction.

15. The memory device of claim 14,
wherein the first surface of the first substrate is a {100} crystal plane of a crystal structure of the first substrate,
wherein the second surface of the second substrate is a {100} crystal plane of a crystal structure of the second substrate, and
wherein a <110> crystal direction of the crystal structure of the first substrate is parallel to the <100> crystal direction of the crystal structure of the second substrate.

16. The memory device of claim 14, wherein the cell structure further includes:

a plurality of cell strings including a plurality of memory cells;
a plurality of word lines respectively connected to the plurality of memory cells; and
a ground selection line connected to the plurality of cell strings,
wherein the plurality of bit lines are connected to one side of the plurality of cell strings.

17. The memory device of claim 14,
wherein the first interlayer insulating layer is in contact with the second interlayer insulating layer, and
wherein the plurality of first metal pads and the plurality of second metal pads are in contact with each other at an interface between the first interlayer insulating layer and the second interlayer insulating layer.

18. The memory device of claim 14, wherein the first substrate and the second substrate have a diamond crystal structure.

19. The memory device of claim 14, wherein a <100> crystal direction of silicon of the first substrate has an angle of 45° with a <100> crystal direction of silicon of the second substrate.

20. A memory device comprising:
a cell structure; and
a peripheral circuit structure,
wherein the cell structure includes:
a plurality of gate electrodes that are stacked on a first surface of a first substrate;
a plurality of channel regions that vertically penetrate the plurality of gate electrodes;
a first interlayer insulating layer on the first surface of the first substrate, the first interlayer insulating layer covering the plurality of gate electrodes and the plurality of channel regions;
a plurality of first metal pads exposed on the first interlayer insulating layer and connected to the plurality of gate electrodes and the plurality of channel regions; and
a plurality of bit lines extending in a first direction,
wherein the peripheral circuit structure includes:
at least one transistor on a second surface of a second substrate;
a second interlayer insulating layer on the second surface of the second substrate, the second interlayer insulating layer covering the transistor; and
a plurality of second metal pads exposed on the second interlayer insulating layer and connected to the transistor,
wherein the peripheral circuit structure is vertically connected to the cell structure by the plurality of first metal pads and the plurality of second metal pads,
wherein a <110> crystal direction of a crystal structure of the first substrate is the same as the first direction, and
wherein the <100> crystal direction of a crystal structure of the second substrate is the same as the first direction.

* * * * *